United States Patent
Tsang et al.

(10) Patent No.: US 7,149,666 B2
(45) Date of Patent: Dec. 12, 2006

(54) METHODS FOR MODELING INTERACTIONS BETWEEN MASSIVELY COUPLED MULTIPLE VIAS IN MULTILAYERED ELECTRONIC PACKAGING STRUCTURES

(75) Inventors: Leung Tsang, Mercer Island, WA (US); Houfei Chen, Seattle, WA (US); Chungchi Huang, Seattle, WA (US); Vikram Jandhyala, Seattle, WA (US)

(73) Assignee: University of Washington, Seattle, WA (US)

( * ) Notice: Subject to any disclaimer, the term of this patent is extended or adjusted under 35 U.S.C. 154(b) by 757 days.

(21) Appl. No.: 10/159,965

(22) Filed: May 30, 2002

(65) Prior Publication Data

US 2003/0072130 A1    Apr. 17, 2003

Related U.S. Application Data

(60) Provisional application No. 60/294,657, filed on May 30, 2001.

(51) Int. Cl.
    *G06F 17/60* (2006.01)
(52) U.S. Cl. .............................. 703/2; 703/13; 703/14; 703/15; 716/12; 716/13; 716/14; 716/15
(58) Field of Classification Search .................. 333/26, 333/24 R; 343/909, 700 MS; 438/31; 174/255; 703/13, 14, 15; 716/12, 13, 14
See application file for complete search history.

(56) References Cited

U.S. PATENT DOCUMENTS

| 5,867,073 | A * | 2/1999 | Weinreb et al. ................ 333/26 |
| 6,774,867 | B1 * | 8/2004 | Diaz et al. ................... 343/909 |
| 2002/0057137 | A1 * | 5/2002 | Marketkar et al. ........ 333/24 R |
| 2003/0087465 | A1 * | 5/2003 | Burrows ........................ 438/31 |
| 2003/0122729 | A1 * | 7/2003 | Diaz et al. ................... 343/909 |
| 2003/0201519 | A1 * | 10/2003 | Lamson et al. .............. 257/662 |
| 2004/0066340 | A1 * | 4/2004 | Hacker et al. ....... 343/700 MS |
| 2004/0163846 | A1 * | 8/2004 | Novak .......................... 174/255 |

OTHER PUBLICATIONS

H.T. Hui and E.K.N. Yung□□Dyalic Green's Function for the Parallerl-Plate Chirowaveguide□□IEEE Proc.-Microw. Antennas Propag., vol. 145, No. 4, Aug. 1998.*

Le-Wei Li□□Input Impedeance of a Probe-Excited Semi-Infinite Rectangular Waveguide with Arbitrary Multilayered Loads: Part I-Dyalic Green's Functions□□IEEE Transactions on Microwave Theory and Techniques, vol. 43, No. 7, Jul. 1995.*

(Continued)

*Primary Examiner*—Fred Ferris
*Assistant Examiner*—Cuong Van Luu
(74) *Attorney, Agent, or Firm*—Ronald M. Anderson

(57) ABSTRACT

Analyzing interactions between vias in multilayered electronic packages that include at least two spaced-apart conducting planes, and multiple vias that connect signal traces on different layers. Voltages at active via ports are represented as magnetic ring current sources, which generate electromagnetic modes inside the plane structure. Substantial electromagnetic coupling between vias occurs. A full-wave solution of multiple scattering among cylindrical vias in planar waveguides is derived using Foldy-Lax equations. By using the equivalence principle, the coupling is decomposed into interior and exterior problems. For the interior problem, the dyadic Green's function is expressed in terms of vector cylindrical waves and waveguide modes. The Foldy-Lax equations for multiple scattering among the cylindrical vias are applied, and waveguide modes are decoupled in the Foldy-Lax equations. The scattering matrix of coupling among vias is then calculated for use in determining signal reflection, transmission, and/or coupling in the electronics package.

34 Claims, 9 Drawing Sheets

OTHER PUBLICATIONS

M.A. Kolbehdari Scattering from a Dielectric Circular Cylinder Partially Clad by a Perfect Electric Conductor IEEE Proc.-Microw. Antennas Propag., vol. 141m No. 6, Dec. 1994.*

John Kraus Electromagnetics, Third Edition, 1984, pp. 534-559 McGraw-Hill Publishing Company.*

Leung Tsang et al Backscattering Enhancement and Clustering Effects of Randomly Distributed Dielectric Cylinders Overlying a Dielectric Half Space Based on Monte-Carlo Simulations IEEE Transactions on Antennas and Propagation, vol. 43, No. 5, May 1995.*

Andrew W. Mathis, Andrew F. Peterson Modeling and Analysis of Interconnects within a Package Incorporating Vias and a Perforated Ground Plane IEEE, 1996 Electronic Components and Technology Conference 0-7803-3286-5/96.*

Qizheng Gu, Y. Eric Yang Modeling and Analysis of Vias in Multilayered Integrated Circuits 1993 IEEE, IEEE transaction on Microwave Theory and Techniques, vol. 41, No. 2, Feb. 1993.*

Otto, D.V. "The Admittance of Cylindrical Antennas Driven From a Coaxial Line." *Radio Science* 2. Sep. 1967: 1031-1042.

Wang, T. et al. "Quasi-Static Analysis of a Microstrip Via Through a Hole in a Ground Plane." *IEEE Transactions of Microwave Theory and Techniques* 36:6. Jun. 1988: 1008-1013.

Gu, Qizheng et al. "Modeling and Analysis of Vias in Multilayered Integrated Circuits." *IEEE Transactions of Microwave Theory and Techniques* 41:2. Feb. 1993: 206-214.

Hsu, Show-Gwo and Ruey-Beei Wu. "Full Wave Characterization of a Through Hole Via Using the Matrix-Penciled Moment Method." *IEEE Transactions of Microwave Theory and Techniques* 42:8. Aug. 1994: 1540-1547.

Gu, Qizheng et al. "Coupled Noise Analysis for Adjacent Vias in Multilayered Digital Circuits." *IEEE Transactions of Microwave Theory and Techniques* 41:12. Dec. 1994: 796-804.

Hsu, Show-Gwo and Ruey-Beei Wu. "Full-Wave Characterization of a Through Hole Via in Multi-Layered Packaging." *IEEE Transactions of Microwave Theory and Techniques* 43:5. May 1995: 1073-1081.

Tsang. L. et al. "Theory of Microwave Remote Sensing." *Wiley Interscience*. New York 1985: 5 pp.

Archambeault, Bruce et al. "EMI/EMC Computational Modeling Handbook Second Edition." Kluwer Academic. 1998: 8 pp.

Tsang. L. et al. "Scattering of Electromagnetic Waves: Theories and Applications." *Wiley-Interscience*. New York 2000: 438-455.

Tsang. L. et al. "Scattering of Electromagnetic Waves: Numerical Simulations." *Wiley-Interscience*. New York 2001: 622-639.

* cited by examiner

METHODS FOR MODELING INTERACTIONS BETWEEN MASSIVELY COUPLED MULTIPLE VIAS IN MULTILAYERED ELECTRONIC PACKAGING STRUCTURES

RELATED APPLICATIONS

This application is based on a prior copending provisional application Ser. No. 60/294,657, filed on May 30, 2001, the benefit of the filing date of which is hereby claimed under 35 U.S.C. §119(e).

FIELD OF THE INVENTION

This invention generally pertains to the numerical simulation of reflected, transmitted, and coupled signals in respect to vias in structures having multilayered geometry, and more specifically, to an adaptation of the Foldy-Lax multiple scattering formula for modeling signal distortion and coupling between massively coupled multiple vias in multilayered chip packages, chip substrates, and printed circuit boards.

BACKGROUND OF THE INVENTION

Components and devices utilizing electrical circuits involving integrated circuit (IC) chips, multi-chip modules, printed circuit boards, connectors, back planes, and cards are generally referred to as electronic packaging. The terms "electronic packaging structure," "electronic package," and "package" are used interchangeably throughout this disclosure to generally refer to any and all of the aforementioned devices and structures. Also included in this definition is the specific case of multilayered packaging wherein multiple substantially parallel conducting ground and power planes are separated by dielectric substrates.

It is desirable and has long been the practice in this technology to employ simulation techniques to establish performance baselines of electronic packages prior to finalizing hardware design and prior to building prototype electronic packages in order to rapidly and inexpensively predict system behavior. While such simulations were simply useful when developing discrete and low density circuits, the preponderance of large scale integration (LSI), very large scale integration (VLSI), and ultra large scale integration (ULSI) implementations has made simulation a necessity. The construction of physical prototypes and long design cycles are undesirable, and hence, rigorous, accurate, and fast simulation of packages is required.

Via structures are predominantly used in multilayered packages and printed circuit boards to connect together traces residing in/on different layers. These packages typically include at least two separated conducting planes that are metallic, and multiple vias extending between the two or more planes for connecting signal traces disposed on the different planes. These packages are used extensively, primarily because of high speed, high densities, and routing complexity. From electromagnetic theory, voltages at the active via ports are represented as magnetic ring current sources, which in turn generate electromagnetic modes inside the plane structure. Substantial electromagnetic coupling occurs, even in well separated vias. The electromagnetic modes propagate along the plane structure and are scattered by other cylindrical vias, induce voltages at idle ports and currents on idle vias, and in turn, affect the active signal-carrying via. Such parallel plate waveguide effects are induced by the multilayered geometry. As a higher order effect, the affected vias can in turn influence the original signal. Because of the waveguide modes, such coupling is not necessarily localized in space. This lack of localization poses considerable design problems, particularly at high frequencies, in achieving reliability, high speed, and in implementing a simulation. Such coupling can even cause unreliable behavior or complete signal failure, along with signal integrity loss, longer delays, and inappropriate switching of signals.

When logic gates alter their states, transient noise is generated on vias. Due to coupling between vias, spurious signals then occur throughout the multilayered structure, primarily through cylindrical wave modes coupling to parallel plate modes. If such signals reach terminal ports, the noise can affect input and output devices through spurious switching signals, thereby degrading system performance.

Several different methods have been developed to attempt to model the crosstalk or coupling mechanism through equivalent circuits. For instance, lumped inductance or capacitance models have been developed. Unfortunately, these models only function well at very low frequencies. In particular, propagation and high-frequency scattering effects are not modeled accurately with this method. Therefore, this method is not suitable for modeling high speed electronic packages.

High accuracy numerical techniques have also been developed to address this problem. The Method of Moments (MoM) is an integral equation method formulated in the frequency domain, while the finite difference time domain (FDTD) is a differential equation method formulated in the time domain. Both methods can theoretically be used to accurately solve the coupling problem. Unfortunately, these techniques require massive computational time and memory overheads and in practice, have therefore been limited to modeling only small portions of an entire electronic package. Accordingly, such techniques are impractical for modeling a complete multi-conductor, multilayered package structure. Indeed, the efficiency of these methods is dramatically worse than the efficiencies of analytic or semi-analytic approaches.

One semi-analytic approach employed to account for coupling noise between coupled vias is disclosed in "Coupled Noise Analysis for Adjacent Vias in Multilayered Digital Circuits," by Qizheng Gu, et al., (*IEEE Transactions on Circuits and Systems*, Vol. 41, No. 12, December 1994). In this reference, coupling between two adjacent vias is analyzed using equivalent magnetic frill array models. These models are combined with even-odd mode decomposition. This method assumes symmetry of the two vias and neglects the influence of other vias. In reality, it is necessary to model large-scale distributed coupling effects among many vias due to large-scale mode coupling and crosstalk. Hence, this technique is not suited to use with multiple coupled vias in a multilayered environment.

Another semi-analytic approach is employed in the Speed2000 modeling application developed by SIGRITY Inc., of Santa Clara, Calif. The Speed2000 modeling application employs an impedance transformation technique. The technique assumes that the package has an inherent input impedance associated with a via that is essentially dependent upon the radius of the via. A numerical model is created for a portion of the physical electronic packaging structure containing the via. The effective input impedance of the numerical model is then determined and transformed to essentially match the input impedance of the physical structure. A time domain technique is subsequently used for the propagation problem. This method, although fast, may provide results having excessive errors. Errors arise because the input impedance of a via is dependent not only on the radius of the via, but also on the radius of the anti-pad, and because the effective impedance can only model the via inside the numerical model and its first order interaction with other portion of the physical structure, but may not account for the multiple scattering effect of all the vias inside the physical structure.

It would therefore be desirable to develop an electronic package modeling technique that can accurately model multiple coupled vias in a multilayered environment. Such a technique should account for the multiple scattering effect of all the vias inside the physical structure, as well as accurately modeling both interior and exterior conditions.

SUMMARY OF THE INVENTION

In accordance with the present invention, a method is provided for analyzing signal reflection, transmission, and coupling between vias in multilayered electronic packaging structures. A physical electronic packaging structure having at least two separated metallic planes and a via is assumed. Each via passes through apertures in the ground plane and in the power plane. These two planes form a parallel-plate waveguide. This package has an inherent admittance and scattering matrix associated with the via and the layer and is independent of the exterior trace.

By using the equivalence principle, each aperture can be replaced by a perfect electric conductor, with equal and opposite magnetic currents on the two sides of the aperture. Thus, a model of the electronic structure can be separated into an exterior problem related to traces with magnetic surface currents, and an interior problem related to magnetic surface currents; each problem can be solved separately. After the solutions of the exterior and interior problems are computed, the two results are related by imposing the condition of equal and opposite magnetic currents.

A numerical model of a portion of the physical electronic packaging structure containing the via is constructed. The admittance matrix is determined by solving the interior problem, and a scattering matrix is obtained by solving the exterior problem. The admittance matrix permits the exterior structure to be coupled into the model with the interior structure, by relating the port voltage and current, while the scattering matrix enables the exterior structure to be coupled into the simulation by relating the port incident and outgoing voltage wave.

For a single via, the interior problem is solved by first applying the dyadic Green's function, expressed in terms of vector cylindrical waves and waveguide modes, to determine the exciting waves. Then, the Foldy-Lax equation is used to relate the exciting waves, the incident waves, and the scattering waves. The waveguide modes are decoupled in the Foldy-Lax equations. This approach enables the admittance matrix of the entire interior geometry to be obtained. The currents on the via surfaces, essential for circuit simulation, are obtained by integrating the magnetic field over the cylinder surface. The equivalent circuit can be integrated into prior art circuit solvers, such as a Simulation Program with Integrated Circuit Emphasis (SPICE) solver. The cylindrical wave expansion of Green's function is derived directly from Maxwell's Equations and includes all the modes of the given structure, thereby facilitating accurate simulations.

The exterior problem is solved by first coupling the exterior problem into the numerical model using the admittance matrix to relate the port voltage and current. Next, the MoM and the matrix pencil method are applied. The solution of the exterior problem is the scattering matrix.

Multilayered structures can be simulated by using the technique of transfer matrix. The numerical model is then further developed to account for more complicated structures that contain from two to hundreds (or thousands of vias). The present invention preferably uses the Foldy-Lax equations for solving the multiscattering problem. This set of equations relates the incident wave to the exciting wave from the source and to all the scattered waves from other cylinders, thus accurately accounting for interactions among all of the vias. The simulation paradigm developed in the present invention yields accurate results that are essentially independent of either the number of vias involved or the effective radii of via pins in the package. The invention can be used to rapidly and accurately simulate the coupling effects of hundreds of massively-coupled vias in a densely packaged circuit, and in printed circuit boards.

The admittance matrix solution from the interior problem and the scattering matrix from the external problem are used to represent the electromagnetic interactions in this multilayered, multi-via geometry. These matrices can easily be modified to integrate directly into commercial electronic package simulation tools. Also, the admittance and scattering matrices for an n-port circuit network can be easily integrated into a system simulation by using microwave network theory.

For electronic packages having vias with small radii, only a single set of harmonics of the vias are coupled to each other, significantly reducing the complexity of the Foldy-Lax equation portion of the model. Additional simplifications to the Foldy-Lax equation portion of the model can be made if the separation distance between layers is small, thereby reducing the number of possible modes propagating from one cylindrical via to another cylindrical via.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein:

FIG. 1 schematically illustrates multiple coupling inside multi-via geometry;

FIG. 2 schematically illustrates the exterior problem portion of the present invention, where the aperture associated with a via has been replaced by a perfect electrical conductor with magnetic surface currents;

FIG. 3 schematically illustrates the interior problem portion of the present invention, where the aperture associated with each via has been replaced by a perfect electrical conductor with magnetic surface currents equal and opposite to that of the exterior problem;

FIG. 4 schematically illustrates the combined interior and exterior problems solved by the present invention, and the voltages and currents corresponding to each problem;

FIG. 5 is a logic diagram illustrating the sequence of steps employed in the present invention;

FIG. 6 schematically illustrates a cylindrical wave expansion of Green's function, as used in the present invention;

FIG. 7 schematically illustrates a source and field point of Green's function;

FIG. 8 schematically illustrates a technique for obtaining an admittance matrix of a single via, in accord with the present invention;

Figure 5:
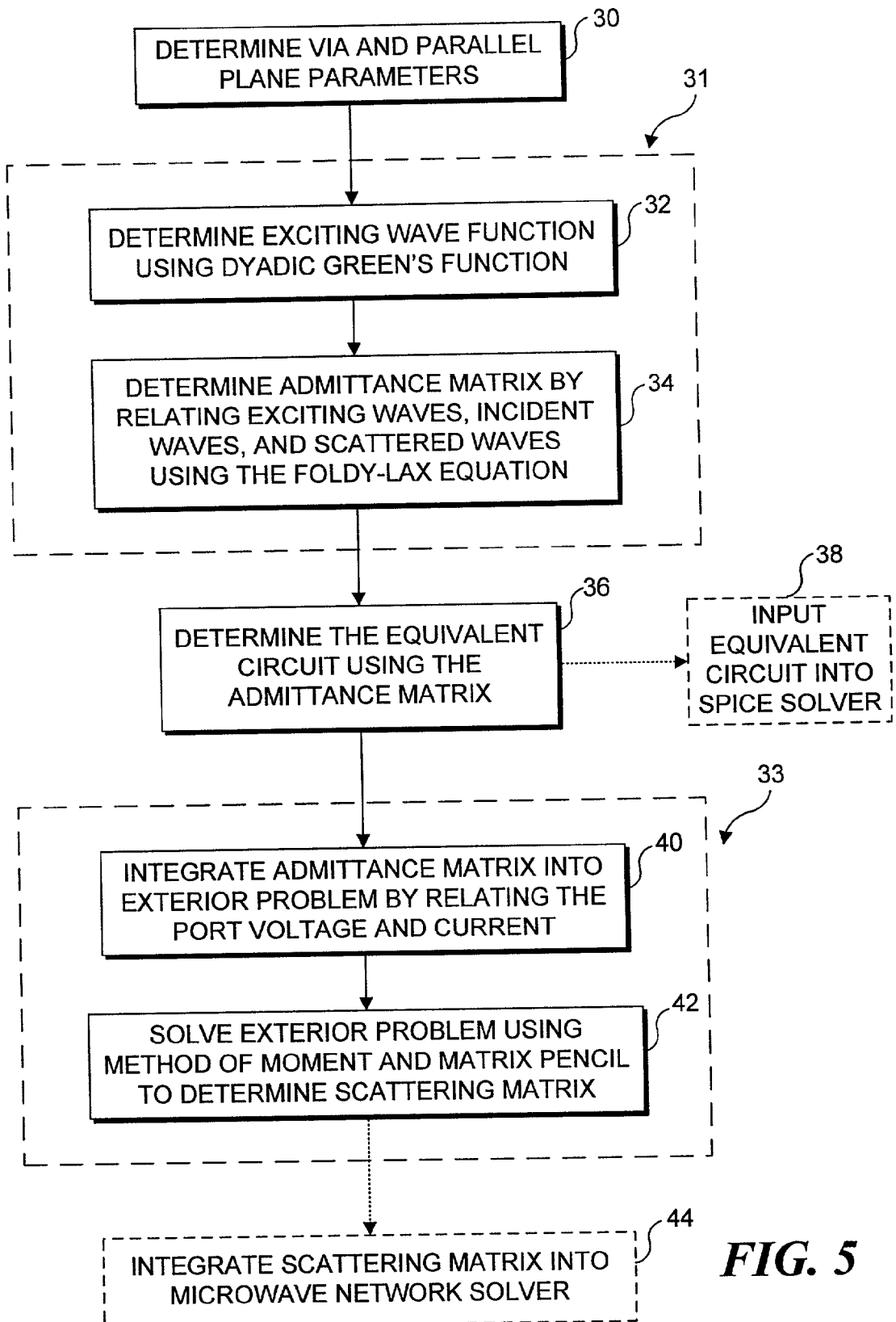
Figure 15:
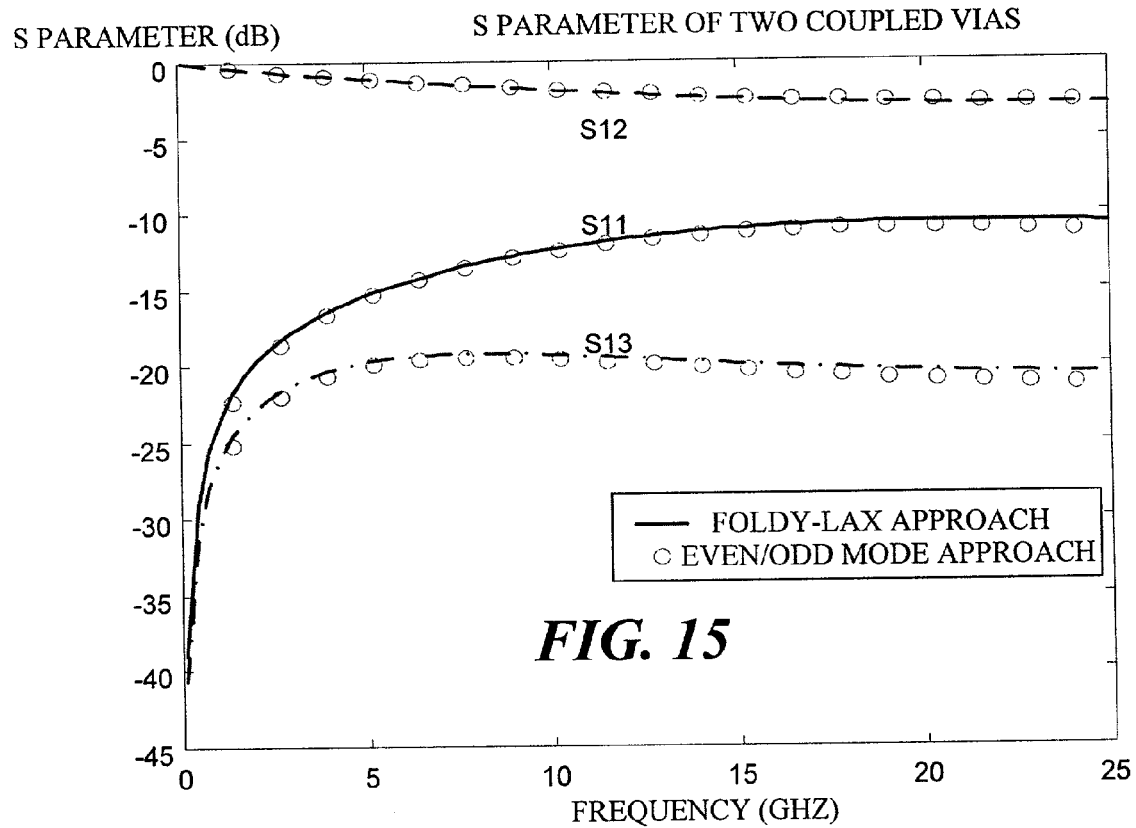
Figure 12:
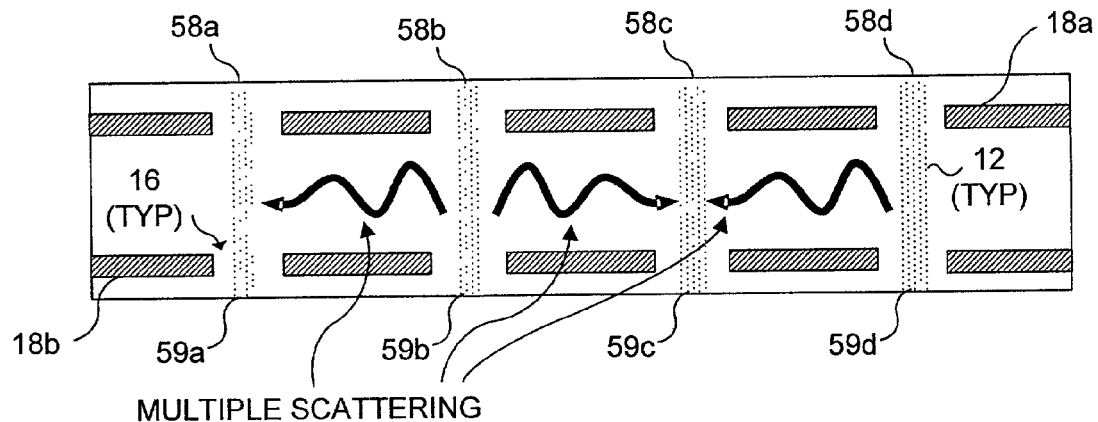
Figure 13:
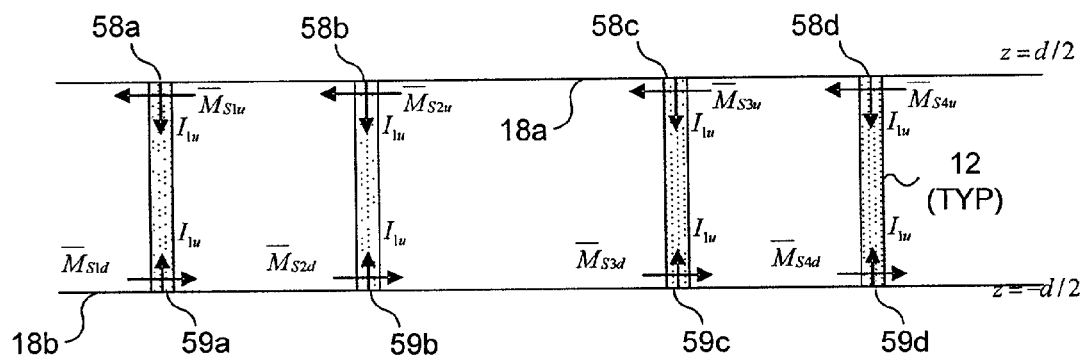
Figure 14:
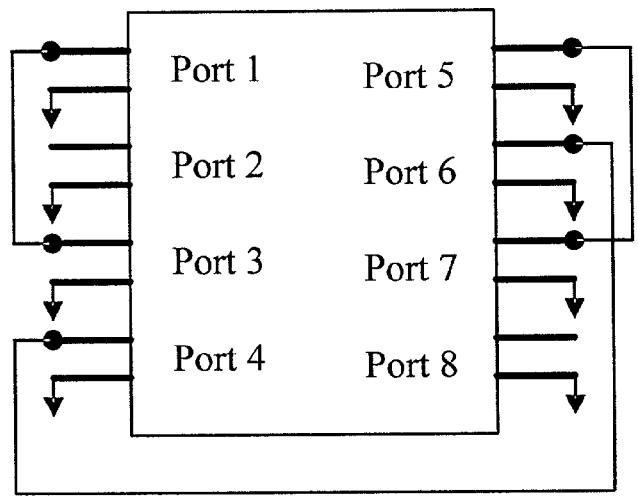
Figure 16:
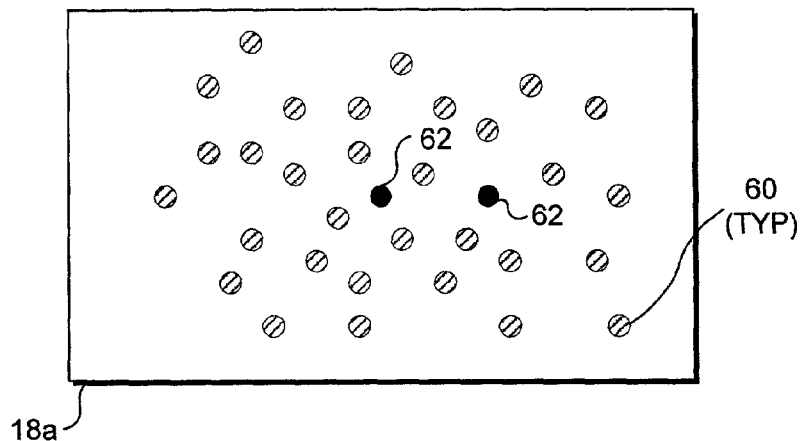
Figure 17:
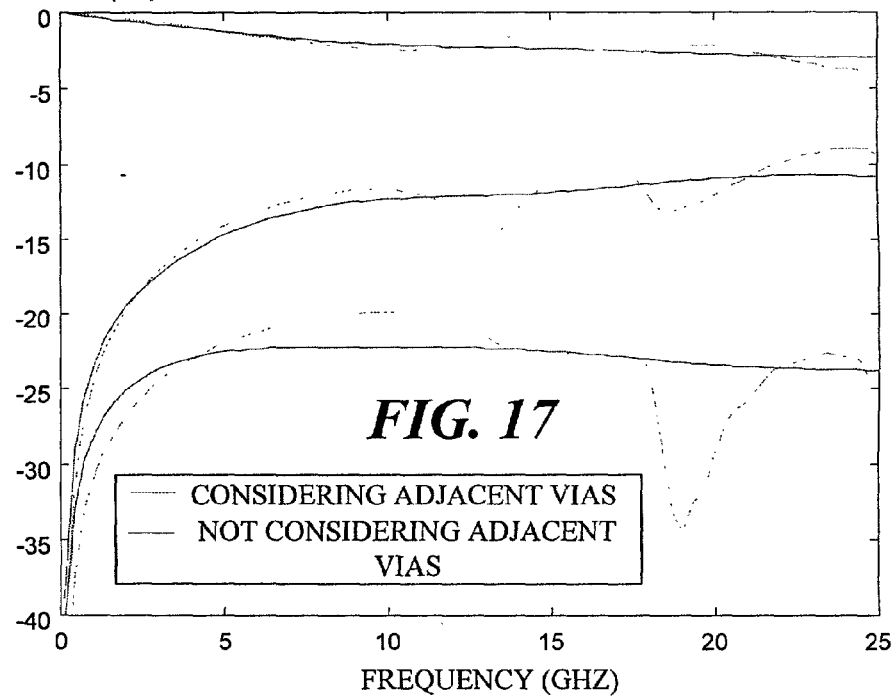
Figure 18:
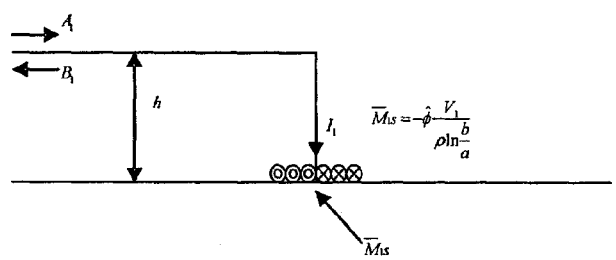
Figure 19:
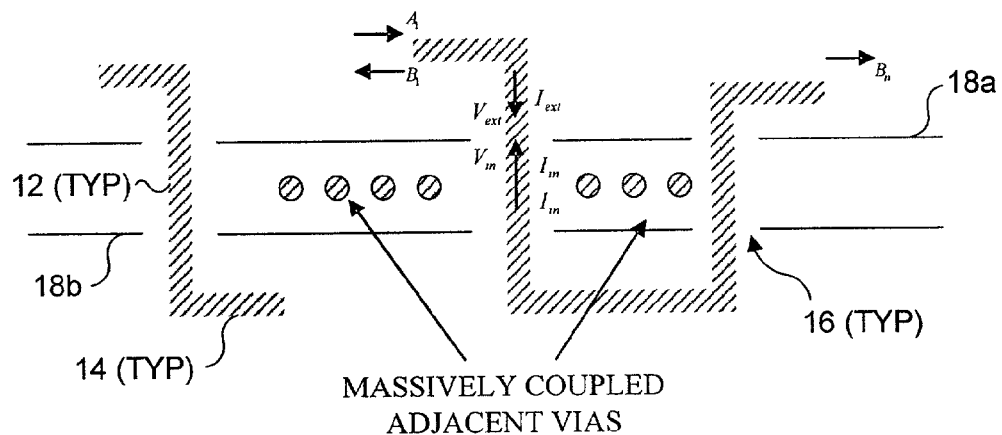
Figure 20:
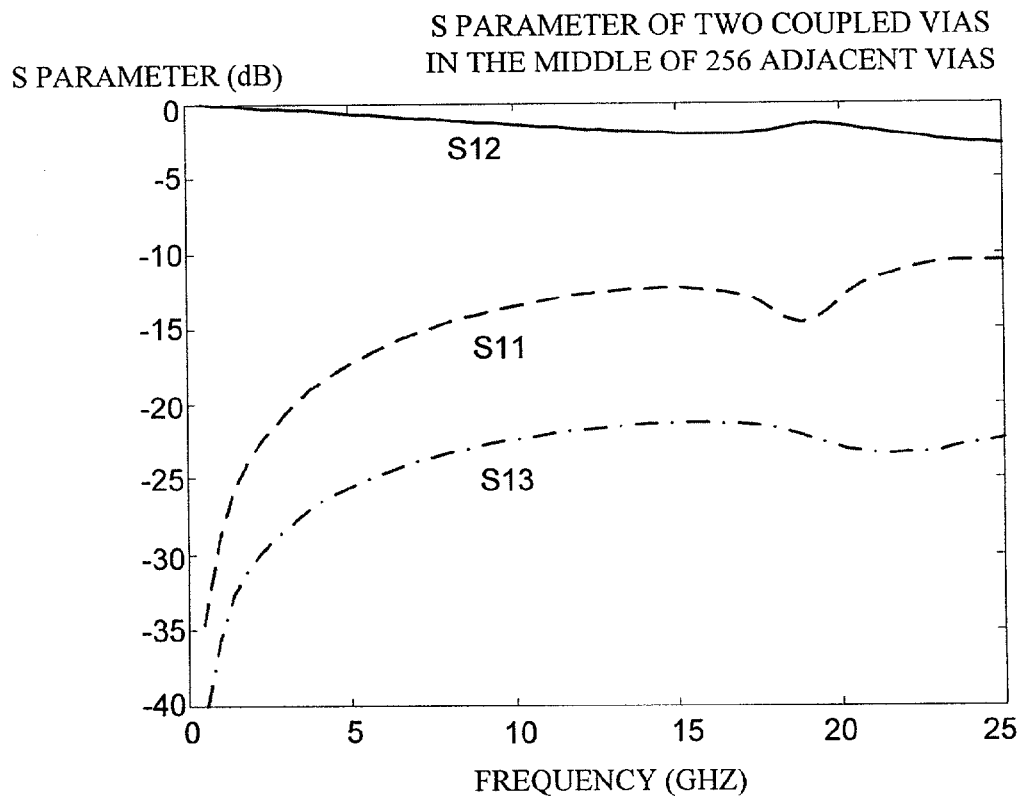
Figure 21:
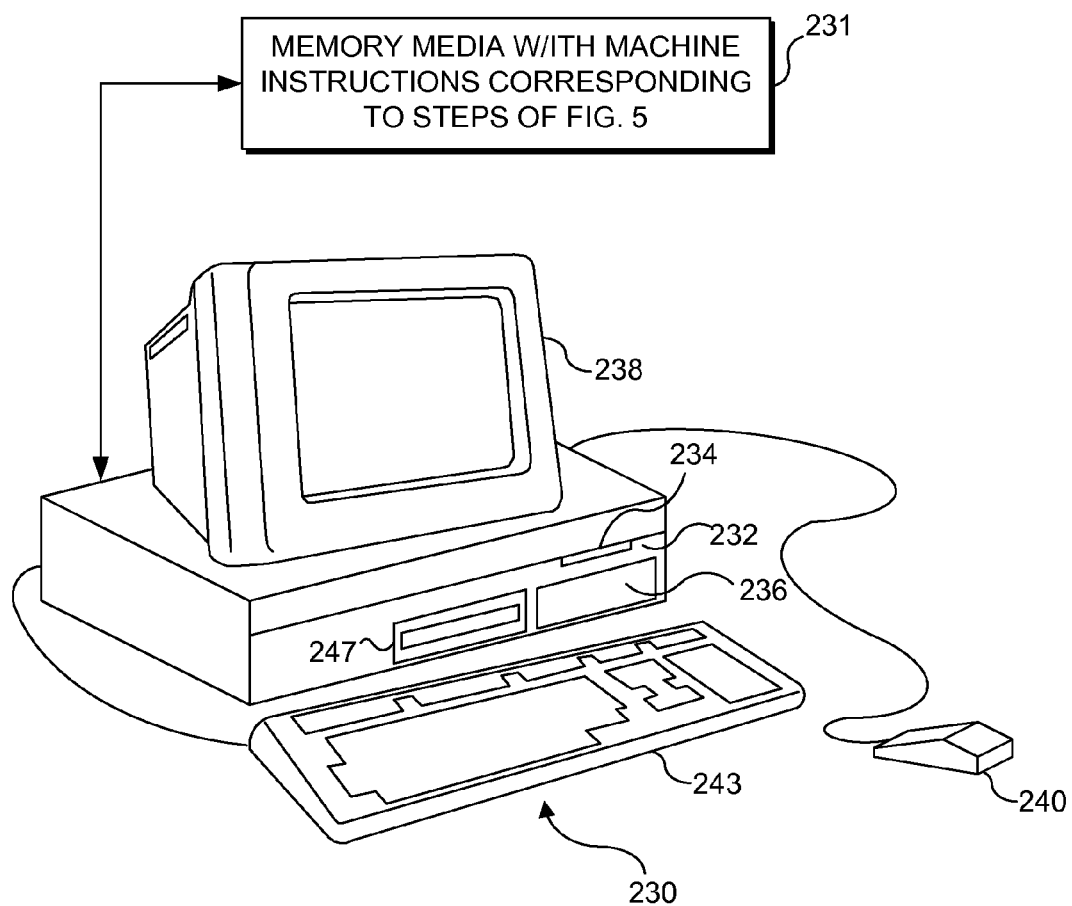

FIG. 12 schematically illustrates multiple scattering inside multi-via geometry;

FIG. 13 schematically illustrates the Foldy-Lax formulation of multiple scattering, in accord with the present invention;

FIG. 14 schematically illustrates a microwave network expression of multi-via geometry;

FIG. 15 is a graphical representation of frequency and S parameters, comparing the Foldy-Lax approach and that of the prior art for modeling coupling between two active vias, disregarding the coupling effects of adjacent, but inactive vias;

FIG. 16 is a schematic illustration of two active vias and a plurality of adjacent, but inactive vias;

FIG. 17 is a graphical representation of S parameters and frequency showing the coupling effect among a large number of adjacent vias, regardless of whether the vias are active or inactive;

FIG. 18 is yet another schematic illustration of the exterior problem, including the notation employed in solving the exterior problem;

FIG. 19 schematically illustrates the connected interior and exterior problems; and FIG. 20 is a graphical representation of S parameters and frequency for combining the exterior and interior problems to illustrate the coupling effect between two active vias in the presence of 256 passive vias; and FIG. 21 schematically illustrates an exemplary computing environment for implementing the method of FIG. 5.

DESCRIPTION OF THE PREFERRED EMBODIMENT

Overview of the Present Invention

Figure 1:
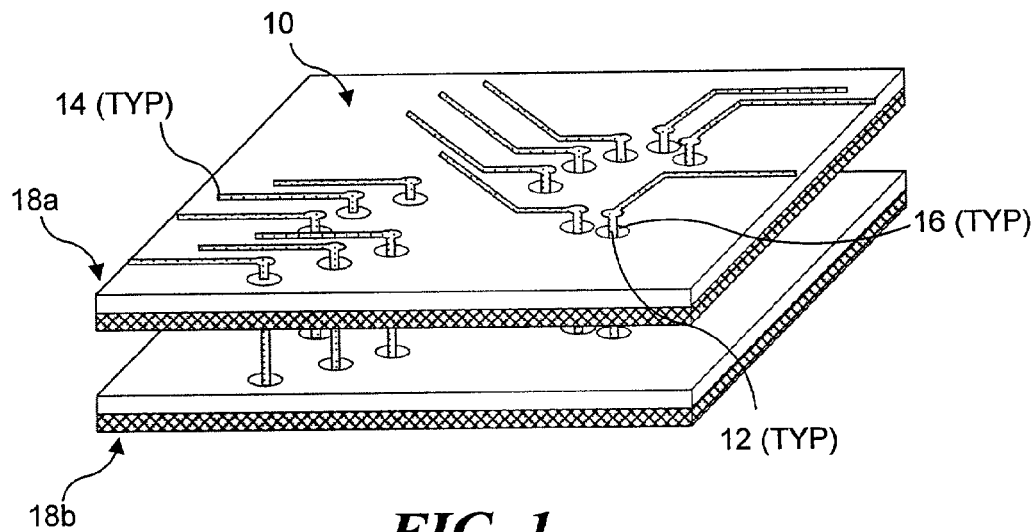

FIG. 1 schematically illustrates a multilayered electronic package 10 with multiple parallel, or nearly parallel, conducting ground and power planes that are separated by dielectric substrates. A plurality of via structures 12 are clearly shown connecting together traces 14 residing in/on different layers or planes. Each via passes through a corresponding aperture 16. The layered geometry includes matched ground and power planes 18a and 18b, defined by metallic layers separated by dielectric layers.

Figure 2:
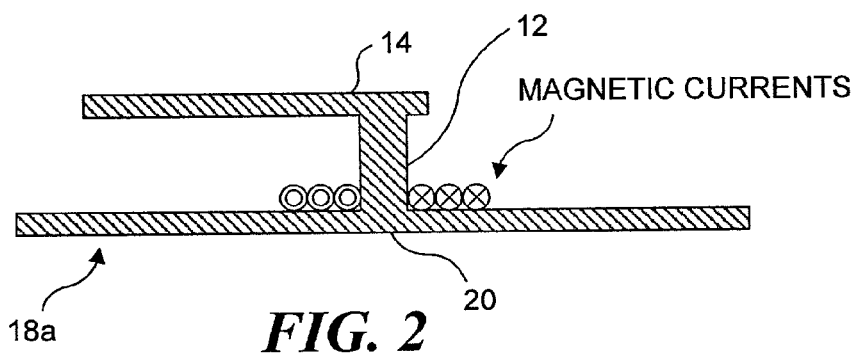

Consider the problem of modeling the dynamics of traces 14 connected to vias 12. Each via 12 passes through a corresponding aperture 16 in ground/power planes 18a and 18b of FIG. 1. For each matched pair of ground/power planes, the paired planes will form a parallel-plate waveguide (i.e., ground/power plane 18a forms a first parallel-plate waveguide, and ground/power plane 18b forms a second parallel-plate waveguide). By using the equivalence principle, each aperture can be replaced by a perfect electric conductor (PEC), with equal and opposite magnetic currents on the two sides of the aperture. Note that because the apertures pass through each ground/power plane, and each ground/power plane includes a conducting plane, by extension each ground/power plane can be treated as a PEC, which results in an exterior problem related to traces with magnetic surface currents, as indicated in FIG. 2, and an interior problem with magnetic surface currents, as indicated FIG. 3. The surface currents correspond to the portions of each ground/power plane through which apertures are formed and enable vias to pass. In each of FIGS. 2 and 3, the apertures have been replaced by a PEC with an equivalent magnetic current.

Figure 3:
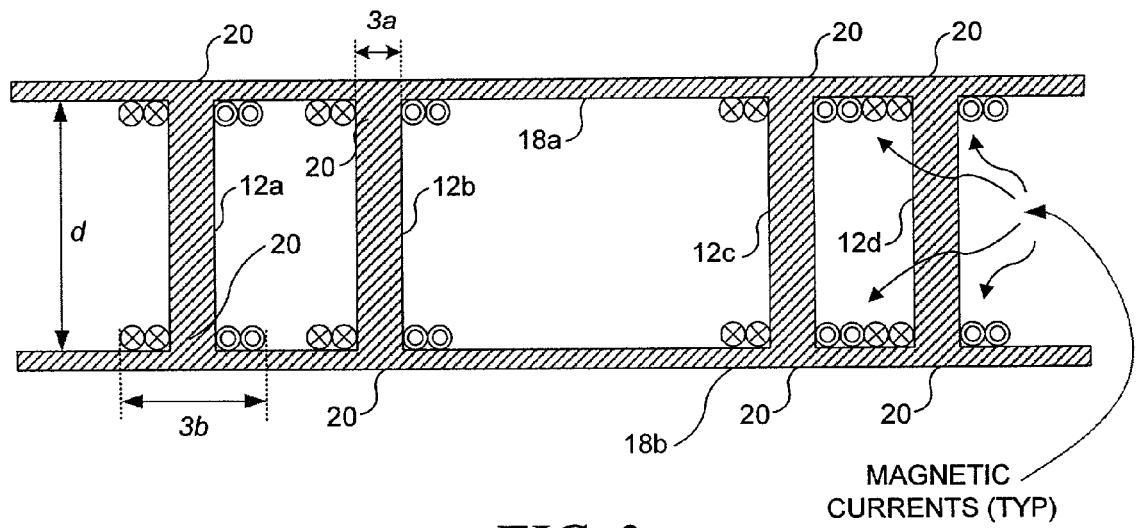
Figure 4:
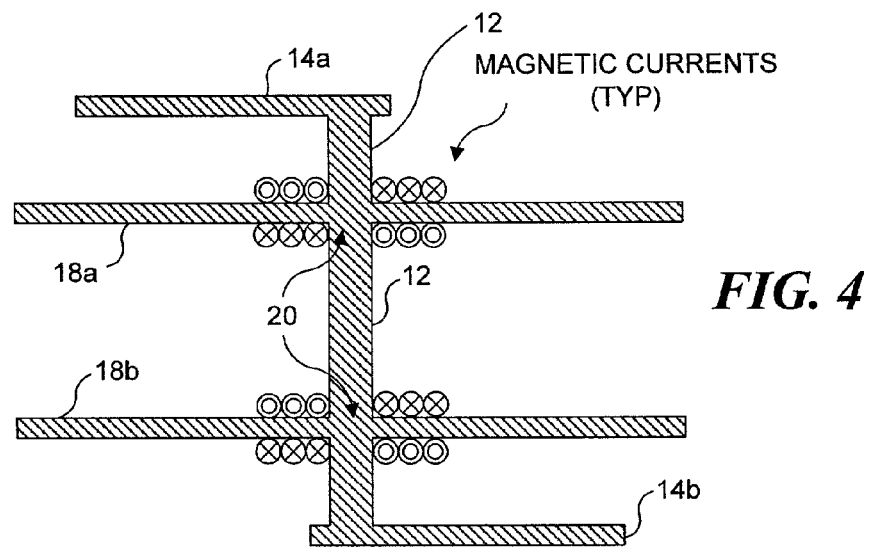

FIG. 2 shows trace 14, a PEC 20, and ground/power plane 18a, while FIG. 3 shows ground/power planes 18a and 18b, and multiple PECs 20. FIG. 4 illustrates the voltages and currents of the interior and exterior problems, showing an equal and opposite magnetic current for each problem. Thus, with the apertures replaced by PECs, a model having parallel-plate waveguides with cylindrical vias is achieved. The exterior problem and the interior problem can be solved separately, and after the solutions of the exterior and interior problems are completed, the two results are related by imposing the condition of equal and opposite magnetic currents. FIG. 3 also illustrates parameters to be used when executing the method of the present invention, including a via inner diameter (indicated as 3a), a via outer diameter (indicated as 3b), and a separation distance between the parallel layers (indicated as d). It should be noted that the dielectric constant of the material of the electronic package (i.e., of the material from which each parallel plane is fabricated) is preferably included as one of the parameters used in executing the method of the present invention. The dielectric constant is factored into the following equations because the value for k (the wave number) utilized in the following equations is dependent on the dielectric constant.

FIG. 5 is a flow chart showing the sequence of logical steps employed by the present invention to analyze an electronic package like that just described. A detailed mathematical description of the analysis, as well as mathematical examples of each step, follow a broad description of the process set forth below. It should be noted that a key element of the present invention is the solution of the interior problem by manipulating a via parameter, via distribution parameters, and the layering parameter, and simulating the multiple coupling effects among a large number of vias.

Referring to FIG. 5, in a block 30, the parameters relating to the vias and the parallel planes are determined and input into the model used for evaluating via interactions in accord with the present invention. For the vias, the parameters that are input include the inner and outer diameters, while for the two parallel planes, the parameters include the separation distance of the planes, and material properties of the planes that affect wave propagations. As described above, the present invention enables signal reflection, signal transmission, and signal coupling between vias in multilayered electronic packaging structures to be determined and evaluated. By employing the equivalence principle, the coupling among traces with many vias is decomposed into interior and exterior problems. A block 31, which includes blocks 32 and 34, corresponds to the steps employed to solve the interior problem, while a block 33, which includes blocks 40 and 42, corresponds to the steps employed to solve the exterior problem.

Figure 6:
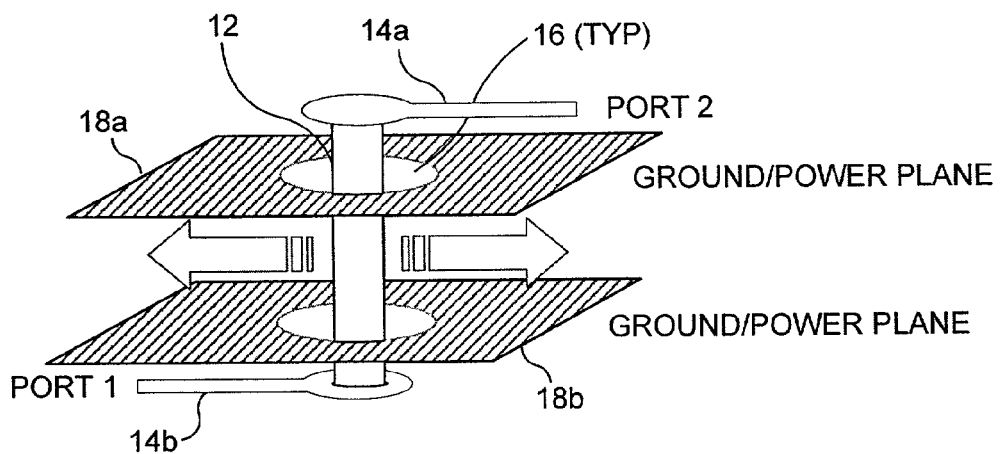

Referring now to block 31, the first component of solving the interior problem is to applying the dyadic Green's function, expressed in terms of vector cylindrical waves and waveguide modes, to get the exciting waves, as indicated in a block 32. The cylindrical shape of vias, as illustrated in FIG. 6, enables the present invention to utilize the vector cylindrical wave expansion of dyadic Green's function, which makes the simulation fast and easy to use. This characteristic is one key benefit of the present invention.

Next, as indicated in a block 34, the Foldy-Lax equation is used to relate the exciting waves, the incident waves, and the scattering waves for the interior problem (i.e., the parallel plate waveguide). Thus, the waveguide modes are decoupled in the Foldy-Lax equation, which enables the admittance matrix of the entire interior geometry to be obtained. Indeed, the solution to the interior problem is the admittance matrix.

Note that the currents on the via surfaces, essential for circuit simulation, can be obtained by integrating the magnetic field over the cylinder surface. As indicated by an optional block 38, the equivalent circuit can be input into one of the SPICE solvers if desired. As those of ordinary skill in the art will recognize, SPICE is one of the most widely used computer programs for analog circuit analysis and is a general-purpose circuit simulation program for nonlinear direct current (DC), nonlinear transient, and linear alternating current (AC) analyses. Circuits that can be analyzed with SPICE may contain resistors, capacitors, inductors, mutual inductors, independent voltage and current sources, different types of dependent sources, lossless and lossy transmission lines, switches, and common semiconductor devices, including diodes, bipolar junction transistors (BJT), junction field effect transistors (JFET), metal semiconductor field effect transistors (MESFET), and metal oxide semiconductor field effect transistors (MOSFET). SPICE was originally developed by the University of California at Berkeley, and many commercial circuit analysis software packages derived from SPICE are available. One embodiment of the present invention uses the Foldy-Lax equations to solve the interior problem, which enables equivalent circuits to be developed for use with a SPICE solver.

Referring once again to FIG. 5, as noted above, block 33 corresponds to the steps required to solve the exterior problem, and includes blocks 40 and 42. The exterior problem is solved by constructing a numerical model of a portion of the physical electronic packaging structure containing the via. The admittance matrix, determined in block 34, permits the exterior structure to be coupled into the simulation with the interior structure, by equating the port voltage and current of the exterior and interior problems, as indicated in block 40. The exterior problem of trace and bent trace is then solved using the MoM and matrix pencil method, as indicated in block 42. The solution of the exterior problem is the scattering matrix. Note that the scattering matrix is not the same as the scattering waves solved for using the Foldy-Lax equation, as described above with respect to the interior problem. The scattering waves for the interior problem refer only to the waves within the parallel plate waveguide. With respect to the scattering matrix (i.e., the solution of the exterior problem), the waves correspond to those waves along the trace, through the via and out at the opposite end of the via.

The admittance matrix solution from the interior problem, and the scattering matrix from the external problem, are used to represent the electromagnetic interactions in this multi-layered multi-via geometry. These matrices can easily be modified for integration directly into commercial electronic package simulation tools. The admittance and scattering matrices for an n-port circuit network can also easily be integrated into a system simulation by using microwave network theory, as indicated in an optional block 44.

Multilayered structures can also be simulated by using the technique of transfer matrix. The numerical model can be further developed to account for more complicated structures that contain from two vias to hundreds (even thousands) of vias. An important technique of the present invention is the use of the Foldy-Lax equations for solving the multiscattering problem. This set of equations relates the incident wave to the exciting wave from the source and to the scattered waves from other cylinders, thus accurately accounting for interactions among all of the vias. The simulation paradigm developed in the present invention yields accurate results that are essentially independent of either the number of vias involved or the effective radius of via pins in the package. The invention can be used to rapidly and accurately simulate the coupling effects of hundreds of massively-coupled vias in a densely packaged circuit.

Cylindrical-Wave Expansion of Green's Function in Parallel Wavegide Modes

Figure 7:
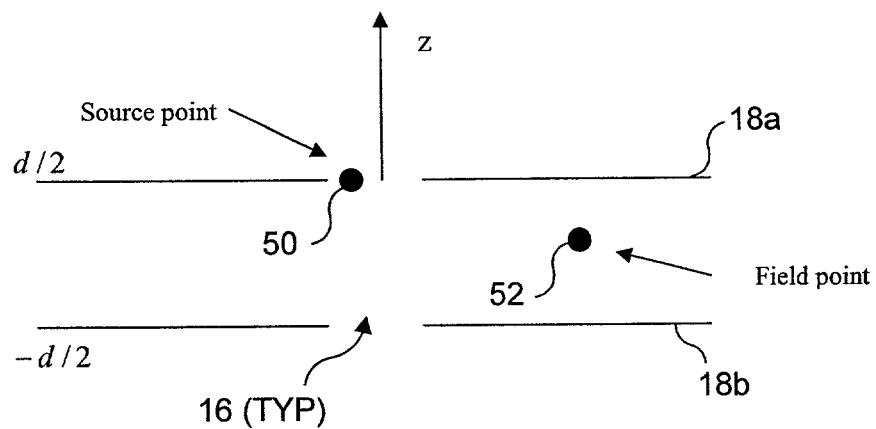

FIG. 7 provides additional detail about how the model of the present invention employs the dyadic Green's function, as mentioned above. Two PECs, at $z=d/2$ and $z=-d/2$ are shown, corresponding to power/ground planes 18a and 18b. A source 50 and a field point 52 are defined as shown, with the source corresponding to the voltage at aperture 16, which can be represented by a magnetic current ring source. Accordingly, the source point will be either at $z=d/2$ or $z=-d/2$. As illustrated, source 50 is at $z=d/2$. Field point 52 can be located anywhere inside the waveguide. For the dyadic Green's function of a parallel plate waveguide, the boundary condition is satisfied on the metal plate by forcing the tangential electric field to equal zero, which results in waveguide modes. For the dyadic Green's function with cylinder post, the previously obtained parallel plate waveguide Green's function will serve as the primary wave, and a boundary condition is satisfied on the cylindrical surface by forcing the tangential electric field to equal zero.

Figure 8:
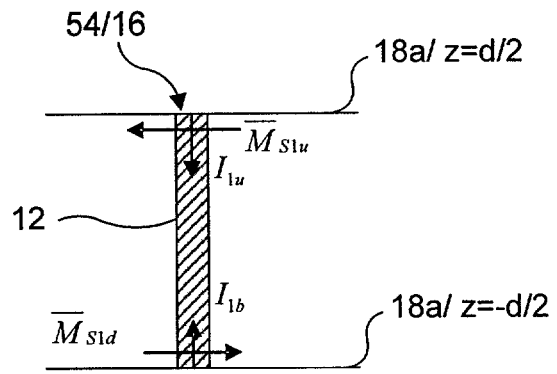
Figure 9:
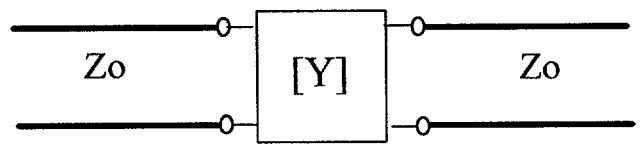
FIG. 9 is a schematic representation of the admittance matrix expression of a single via.
Figure 10:
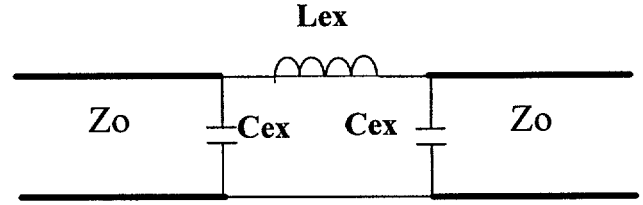
FIG. 10 is a schematic representation of an equivalent circuit for a single via.

The excitation source of via 12 is the voltage at a port 54 (i.e., ports correspond to apertures in power/ground planes through which vias are directed), as in FIG. 8. The voltage is expressed in magnetic ring source and generates the magnetic field inside the structure. By integrating the resulting magnetic field over the cylinder corresponding to via 12, the current induced by the voltage source is obtained. The admittance/impedance matrix of the single via geometry can then be calculated and used in the circuit simulation, as shown in FIG. 9. From the admittance/impedance matrix, the equivalent circuit of the structure can be extracted, as shown in FIG. 10. Referring to FIG. 10, $Y1=Y11+Y12; Y2/2=-Y12; -Y12=-Y21$; where Y11, Y12, Y21, Y22 are admittance matrix elements. These admittance matrix elements can be calculated by using the admittance matrix of the interior problem.

Figure 11:
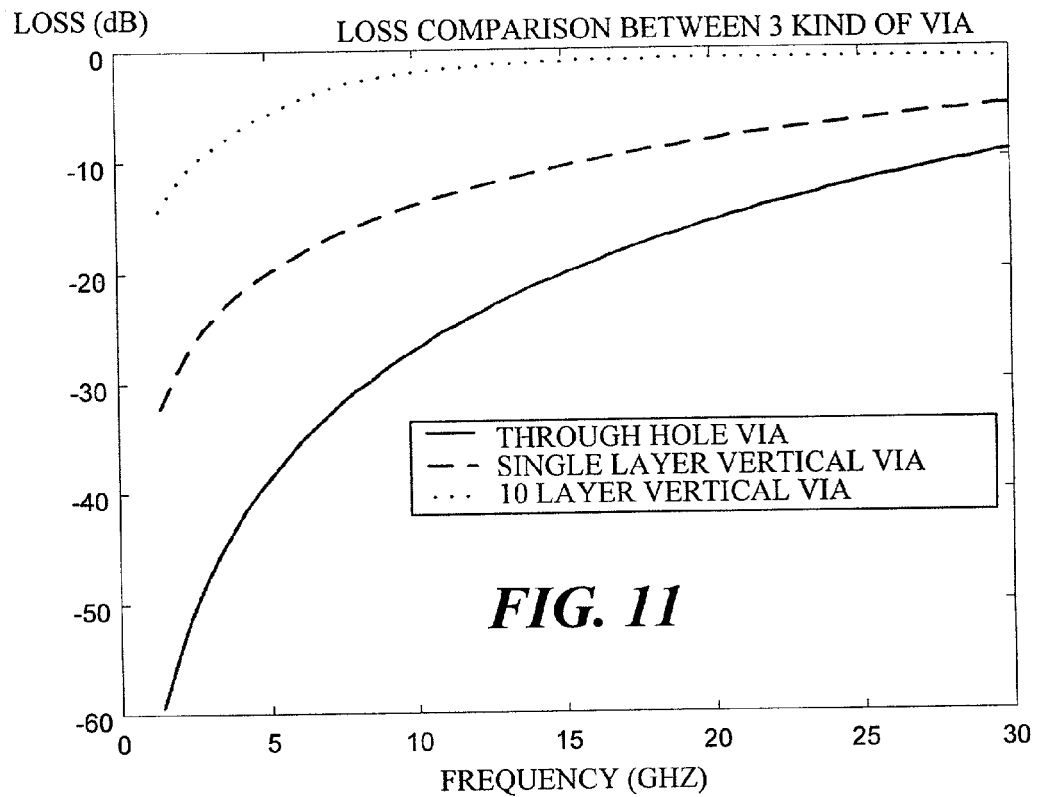
FIG. 11 is a graphical representation of radiation loss versus frequency for three kinds of vias.

FIG. 11 shows the propagation characteristics of a through-hole via, single-layered via, and multilayered via. The reflection increases with the layering because electromagnetic energy is coupled to the waveguide modes.

A more exhaustive mathematical description of the use of the dyadic Green's function in the present invention follows, with reference to the multi-via model illustrated in FIG. 3. Consider two perfect electric conductors at $z=d/2$ and $z=-d/2$ (noting that the apertures normally present in power/ground planes 18a and 18b have been replaced with a PEC, such that each power/ground plane can be considered a PEC). For the multi-via problem, the equivalence principle is invoked, with equivalent magnetic sources at $z'=\pm d/2$. These sources correspond to the original locations of the apertures in each power/ground plane, and the sources are disposed at each PEC 20 identified in FIG. 3.

Consider the general case of any magnetic source at z' between the two PECs corresponding to power/ground planes 18*a* and 18*b* (i.e., between any PEC 20 of FIG. 3). As noted above, the present invention utilizes the dyadic Green's function to represent the magnetic field. The primary Green's function $\overline{G}_P$ is the direct wave from the source with multiple reflections by the parallel plates. The solution is expressed in terms of waveguide modes and also in terms of vector cylindrical waves for adapting to via scattering later. The notations employed herein are based on those previously employed in publications relating to scattering of electromagnetic waves (*The Theory of Microwave Remote Sensing*, Wiley Interscience, 1985; L. Tsang, J. A. Kong and R. T. Shin; and *Scattering of Electromagnetic Waves, Volume* 1; Wiley Interscience, 2000, L. Tsang, J. A. Kong and K. H. Ding and *Scattering of Electromagnetic Waves, Volume* 2; Wiley Interscience, 2001, L. Tsang, J. A. Kong, K. H. Ding and C. Ao), with the exp(-iωt) dependence in the three references changed to exp(jωt) dependence herein. Let $$\bar{I}_t = \hat{x}\hat{x} + \hat{y}\hat{y}$$

be the transverse dyad. Then $$\overline{H} = -j\omega\varepsilon \int\int dx'dy' \overline{G}(\bar{r},\bar{r}') \cdot \overline{M}_s(\bar{r}') \quad (1)$$

where $\overline{G}$ is the dyadic Green's function and $\overline{M}_s$ is the magnetic surface current.

The waveguide mode solutions are $$k_{zl} = \frac{l\pi}{d} \quad (2)$$

with l=0, 1, 2, . . . for TM modes and l=1, 2, . . . for TE modes.

Magnetic TE and TM modal solutions are defined as follows:

$$Rg\overline{H}_n^{TE}(k_\rho, k_z, \bar{\rho}, z) = \quad (3)$$

$$\frac{e^{-jn\phi}}{\eta}\left\{\begin{array}{l}-\hat{\rho}\dfrac{jk_\rho k_z}{k}J_n'(k_\rho\rho)\cos(k_z z)\\-\hat{\phi}\dfrac{nk_z}{k\rho}J_n(k_\rho\rho)\cos(k_z z) - \hat{z}\dfrac{k_\rho^2}{k}J_n(k_\rho\rho)j\sin(k_z z)\end{array}\right\}$$

$$Rg\overline{H}_n^{TM}(k_\rho, k_z, \bar{\rho}, z) = \frac{j}{\eta}\left\{-\hat{\rho}\frac{jn}{\rho}J_n(k_\rho\rho) - \hat{\phi}k_\rho J_n'(k_\rho\rho)\right\}e^{-jn\phi}\cos(k_z z) \quad (4)$$

where Rg stands for regular, with Bessel functions being used. Without the Rg, the corresponding functions are Hankel functions of the second kind. Also, $k_\rho = \sqrt{k^2-k_z^2}$. The two vector cylindrical wave functions are $$\overline{m}_n(k_\rho, k_z, \bar{\rho}) = -\hat{\rho}\frac{jn}{\rho}H_n^{(2)}(k_\rho\rho) - \hat{\phi}k_\rho H_n^{(2)'}(k_\rho\rho) \quad (5)$$

and $$\overline{n}_n(k_\rho, k_z, \bar{\rho}) = -\hat{\rho}\frac{jk_\rho k_z}{k}H_n^{(2)'}(k_\rho\rho)$$

$$-\hat{\phi}\frac{nk_z}{k\rho}H_n^{(2)}(k_\rho\rho) + \hat{z}\frac{k_\rho^2}{k}H_n^{(2)}(k_\rho\rho). \quad (6)$$

In terms of the vector cylindrical waves expressed in modal solutions, the primary dyadic Green's functions are expressed below. Note that the upper sign is employed for $\dot{z} > z'$, and the lower sign for z<z'.

For ρ<ρ', $$\overline{G}_P(\bar{r},\bar{r}')\cdot\bar{I}_t = -\frac{\eta}{4d}\sum_{n,l}\frac{(-1)^{n+1}}{k_{\rho l}^2}f_l\left(1+e^{\mp 2jk_{zl}(z'\pm d/2)}\right)e^{\pm 2jk_{zl}(z'\pm d/2)}\times \quad (7)$$

$$Rg\overline{H}_n^{TM}(k_{\rho l}, k_{zl}, \bar{\rho}, z \mp d/2)\overline{m}_{-n}(k_{\rho l}, k_{zl}, \bar{\rho}')e^{jn\phi'}\cdot\bar{I}_t +$$

$$\frac{j\eta}{4d}\sum_{n,l}\frac{(-1)^{n+1}}{k_{\rho l}^2}f_l\left(1+e^{\mp 2jk_{zl}(z'\pm d/2)}\right)e^{\pm jk_{zl}(z'\pm d/2)}\times$$

$$Rg\overline{H}_n^{TE}(k_{\rho l}, k_{zl}, \bar{\rho}, z \mp d/2)\overline{n}_{-n}(k_{\rho l}, k_{zl}, \bar{\rho}')e^{jn\phi'}\cdot\bar{I}_t$$

and for ρ > ρ', $$\overline{G}_P(\bar{r},\bar{r}')\cdot\bar{I}_t = -\frac{\eta}{4d}\sum_{n,l}\frac{(-1)^{n+1}}{k_{\rho l}^2}f_l\left(1+e^{\mp 2jk_{zl}(z'\pm d/2)}\right)e^{\pm jk_{zl}(z'\pm d/2)}\times \quad (8)$$

$$\overline{H}_n^{TM}(k_{\rho l}, k_{zl}, \bar{\rho}, z \mp d/2)Rg\overline{m}_{-n}(k_{\rho l}, k_{zl}, \bar{\rho}')e^{jn\phi'}\cdot\bar{I}_t +$$

$$\frac{j\eta}{4d}\sum_{n,l}\frac{(-1)^{n+1}}{k_{\rho l}^2}f_l\left(1+e^{\mp 2jk_{zl}(z'\pm d/2)}\right)e^{\pm jk_{zl}(z'\pm d/2)}\times$$

$$\overline{H}_n^{TE}(k_{\rho l}, k_{zl}, \bar{\rho}, z \mp d/2)Rg\overline{n}_{-n}(k_{\rho l}, k_{zl}, \bar{\rho}')e^{jn\phi'}\cdot\bar{I}_t$$

$$f_l = \frac{1}{2}, \text{ for } l = 0 \quad (9)$$
$$= 1, \text{ for } l = 1, 2, \ldots$$

Foldy-Lax Equations for Scattering with Multiple Cylinders

Once the dyadic Green's functions have been employed to determine the exciting wave as described above, the next step corresponds to block 34 of FIG. 5, in which the Foldy-Lax equations are employed to determine the admittance matrix. Note that block 34 represents the second key step of the interior problem solution (i.e., block 31 of FIG. 5) and simulates the coupling effect among a large number of vias in layered geometry by using a Foldy-Lax multiple scattering formulation. Such multiple scatterings are schematically illustrated in FIG. 12. Each aperture 16 in paired parallel plates corresponding to power/ground planes 18*a* and 18*b* is associated with a port, such that ports 58*a*–58*d* are disposed adjacent to power/ground planes 18*a*, and ports 59*a*–59*d* are disposed adjacent to power/ground planes 18*b*. Four vias 12 also shown, along with schematic representations of multiple scatterings among such vias, but it will be understood that many more vias might be included.

The Foldy-Lax multiple scattering equations are derived using vector cylindrical waves and waveguide modes as basis functions. In active via ports, the voltage sources generate a vector cylindrical wave, which propagates along the parallel plate waveguide, and such waves are scattered by other vias. There is strong multiple scattering among the vias with slow decay over distance, because of the waveguide effect. The Foldy-Lax equations relate the excited, incident, and scattered waves of each cylinder. This set of equations describes the coupling effect among a large number of vias. It is important to recognize that the Foldy-Lax equations expressed in vector cylindrical waves are decoupled among the waveguide modes. There is no coupling between Transverse Electric (TE) and Transverse Magnetic (TM) waves, because the cylinders are assumed to be perfect electric conductors (under the model employed in the present invention). In terms of the matrix equation, this decoupling significantly reduces the dimension of the matrix equation, as one only needs to solve the Foldy-Lax equation for each waveguide mode separately.

This decoupling is useful when multiple waveguide modes are excited for waveguides of moderate thickness. For such cases, if discretization in the z direction is done using sub-sectional basis functions, a large number of basis functions are required, and they are coupled in multiple scattering.

FIG. 13 shows the equivalent model of multiple via geometry, it being understood that there can be multiple excitations at different vias. Note the similarities between FIGS. 12 and 13, particularly that FIG. 13 also illustrates paired parallel plates corresponding to power/ground planes 18$a$ and 18$b$, ports 58$a$–58$d$ and ports 59$a$–59$d$, and four vias 12.

Using the Foldy-Lax equations, the magnetic fields can be calculated. By integrating a field over the cylinder, the induced current on each cylinder is obtained. The entire structure can be modeled as a multi-port microwave network, as is schematically illustrated in FIG. 14. The currents and voltages of the interior problem are related as follows:

$$I_{iu} = \sum_{j=1}^{N} Y_{ij}^{UU} V_{ju} + \sum_{j=1}^{N} Y_{ij}^{UB} V_{jb} \quad (10)$$

$$I_{ib} = \sum_{j=1}^{N} Y_{ij}^{BU} V_{ju} + \sum_{j=1}^{N} Y_{ij}^{BB} V_{jb}$$

FIG. 15 graphically illustrates the coupling effect between two vias. In the prior art, a coupling model based on a capacitor plate antenna has been developed. FIG. 15 compares the results obtained using the techniques of the present invention (referred to in FIG. 15 as the Foldy-Lax Approach) with those obtained using the capacitor plate antenna model of the prior art (referred to in FIG. 15 as the Even-Odd Mode Approach). The results are in good agreement, indicating that the techniques of the present invention are at least as accurate as prior art techniques and can be more easily executed.

FIG. 16 is a plan view of power/ground plane 18$a$, showing the geometry of a large number of adjacent vias, some of which are active vias 62, and some of which are passive vias 60. The objective is to obtain the scattering matrix of the two active vias in the presence of many passive vias. FIG. 17 graphically illustrates the coupling effects of passive vias. The solid lines represent the coupling effects as determined using the capacitor plate antenna model of the prior art, which ignores the effects introduced by passive vias. The dash lines represent the coupling effects introduced by passive vias, as determined using the techniques of the present invention. The graph of FIG. 17 is based on the coupling effect of two vias among 256 adjacent vias. The large difference in the coupling effects is due to the ability of the present invention to take into account the scattered waves from the adjacent vias.

A more exhaustive mathematical description of the use of the Foldy-Lax equations in solving the interior problem in accord with the present invention will now be provided. Consider N cylinders between the two parallel plates centered at $\bar{\rho}_1, \bar{\rho}_2 \ldots \bar{\rho}_N$ and magnetic surface current densities $\overline{M}_s = \overline{M}_{su}$ at ($\bar{\rho}'$, $z'=d/2$) and $\overline{M}_s = \overline{M}_{sb}$ at ($\bar{\rho}'$, $z'=-d/2$). The multiple scattering can be formulated in terms of Foldy-Lax multiple scattering equations. The upper sign is used for results with a source $\overline{M}_{su}$ at ($\bar{\rho}'$, $z'=d/2$), and the lower sign for results with a source $\overline{M}_{sb}$ at ($\overline{92}'$, $z'=-d/2$).

The Foldy-Lax multiple scattering equations are formulated as follows. After multiple scattering, the final exciting field of cylinder p is:

$$\overline{H}_{ex}^{(p)} = \sum_{n,l} w_{lm}^{TM(p)} Rg\overline{H}_m^{TM}(k_{\rho l}, k_{zl}, \bar{\rho} - \bar{\rho}_p, z \pm d/2) + \quad (11)$$

$$\sum_{n,l} w_{lm}^{TE(p)} Rg\overline{H}_m^{TE}(k_{\rho l}, k_{zl}, \bar{\rho} - \bar{\rho}_p, z \pm d/2)$$

where $w_{lm}^{TM(p)}$ and $w_{lm}^{TE(p)}$ are exciting field coefficients to be solved by using the Foldy-Lax equations.

The T-matrix coefficients for perfect conducting cylinders are $$T_n^{(M)} = T_{-n}^{(M)} = \frac{J'_n(k_{\rho l}a)}{H_n^{(2)'}(k_{\rho l}a)} \quad (12)$$

$$T_n^{(N)} = T_{-n}^{(N)} = \frac{J_n(k_{\rho l}a)}{H_n^{(2)}(k_{\rho l}a)}. \quad (13)$$

The Foldy-Lax equations state that the final exciting field of cylinder q is equal to the incident field plus scattered fields from all cylinders, except the scattered field from itself. The scattered field from cylinder p incident on cylinder q can be re-expressed by using the translation addition theorem for the modal solution $\overline{H}_n^{TE}$ and $\overline{H}_n^{TM}$.

The Foldy-Lax multiple scattering equations are in the following form:

$$w_{ln}^{TM(q)} = a_{ln}^{TM(q)} + \sum_{\substack{p=1 \\ p \neq q}}^{N} \sum_{m=-\infty}^{\infty} H_{n-m}^{(2)}(k_{\rho l}|\bar{\rho}_p - \bar{\rho}_q|) \times \quad (14)$$

$$e^{j(n-m)\phi_{\bar{\rho}_p \bar{\rho}_q}} T_m^{(N)} w_{lm}^{TM(p)}$$

$$w_{ln}^{TE(q)} = a_{ln}^{TE(q)} + \sum_{\substack{p=1 \\ p \neq q}}^{N} \sum_{m=-\infty}^{\infty} H_{n-m}^{(2)}(k_{\rho l}|\bar{\rho}_p - \bar{\rho}_q|) \times$$

$$e^{j(n-m)\phi_{\bar{\rho}_p \bar{\rho}_q}} T_m^{(N)} w_{lm}^{TE(p)}$$

where $a_{ln}^{TM(q)}$, $a_{ln}^{TE(q)}$ are the fields of the current source incident on cylinder q and can be calculated by using the primary Green's function of the previous section. In the Foldy-Lax equations, there is no coupling between different l because each l corresponds to a specific $k_z$. Neither is there coupling between the TE and TM waves, because the cylinders are perfectly conducting. Note that the primary Green's function is translationally invariant in the horizontal plane.

Using the translational addition theorem and translational invariance of $\overline{\overline{G}}_P(\vec{r}, \vec{r}')$ in the horizontal direction, the field from the magnetic surface current source $\overline{M}_s$ incident on cylinder q is:

$$-j\omega\varepsilon \int d\vec{\rho}' \overline{\overline{G}}_P(\vec{r}, \vec{r}') \cdot \overline{M}_s(\vec{\rho}') = -j\omega\varepsilon \int d\vec{\rho}' \overline{\overline{G}}_P \quad (15)$$
$$(\vec{\rho} - \vec{\rho}_q, z, \vec{\rho}' - \vec{\rho}_q, z') \cdot$$
$$\overline{M}_s(\vec{\rho}')$$

Using the expression of the primary dyadic Green's function from Equations (7) and (8) in the above, the field coefficients incident on cylinder q are computed as $$a_{ln}^{TM(q)} = \frac{\eta j \omega \varepsilon}{2d} \frac{(-1)^{n+1}}{k_{\rho l}^2} f_l \int d\vec{\rho}' \times \quad (16)$$
$$\overline{m}_{-n}(k_{\rho l}, k_{zl}, \vec{\rho}' - \vec{\rho}_q) e^{jn\phi_{\vec{\rho}' \vec{\rho}_q}} \cdot \overline{M}_s(\vec{\rho}')$$
$$= \frac{\eta \omega \varepsilon}{2d} \frac{(-1)^{n+1}}{k_{\rho l}^2} f_l \int d\vec{\rho}' \times \quad (17)$$
$$\overline{n}_{-n}(k_{\rho l}, k_{zl}, \vec{\rho}' - \vec{\rho}_q) e^{jn\phi_{\vec{\rho}' \vec{\rho}_q}} \cdot \overline{M}_s(\vec{\rho}').$$

After the Foldy-Lax multiple scattering equations are solved, the surface currents on the cylinder (p) are $$J_s^{(p)} = \sum_{m,l} w_{lm}^{TM(p)} \overline{J}_s^{TM}(k_{\rho l}, k_{zl}, x \pm d/2) + \quad (18)$$
$$\sum_{m,l} w_{lm}^{TE(p)} \overline{J}_s^{TE}(k_{\rho l}, k_{zl}, z \pm d/2)$$

where the modal surface currents are $$\overline{J}_{sn}^{TE}(k_\rho, k_z, z) = -\frac{2j/\eta \pi k_\rho a) e^{-jn\phi}}{H_n^{(2)'}(k_\rho a)} \times \quad (19)$$
$$\left[-\hat{z}\frac{nk_z}{ka}\cos(k_z z) + \hat{\phi}\frac{k_\rho^2}{k}j\sin(k_z z)\right]$$

$$\overline{J}_{sn}^{TM}(k_\rho, k_z, z) = \hat{z}\frac{(2/\eta\pi a)}{H_n^{(2)}(k_\rho a)}\{\cos k_z z\}e^{-jn\phi}. \quad (20)$$

The Excitation of Magnetic Frill Currents

Consider magnetic frill currents at aperture j with $\overline{M}_{su}$ at $z'=d/2$ and $\overline{M}_{sb}$ at $z'=-d/2$:

$$\overline{M}_{su}(\vec{\rho}') = -\frac{V_{ju}}{|\vec{\rho}' - \vec{\rho}_j|\ln(b/a)}\hat{\phi}'\frac{\rho}{\rho\rho_j}, \text{ for } a \leq |\vec{\rho}' = \vec{\rho}_j| \leq b \quad (21)$$

$$\overline{M}_{sb}(\vec{\rho}') = -\frac{V_{jb}}{|\vec{\rho}' - \vec{\rho}_j|\ln(b/a)}\hat{\phi}'\frac{\rho}{\rho\rho_j}, \text{ for } a \leq |\vec{\rho}' = \vec{\rho}_j| \leq b. \quad (22)$$

First consider the excitation terms of $a_{ln}^{TM(j)}$ and $a_{ln}^{TE(j)}$ for cylinder j.

Because $\overline{n}_0(k_{\rho l}, k_{zl}, \vec{\rho}' - \vec{\rho}_j)=0$, $$a_{ln}^{TM(j)} = \frac{kj}{d}\frac{(-1)^l}{k_{\rho l}^2}f_l\frac{\pi V_j}{\ln(b/a)}\delta_{n0}[H_0^{(2)}(k_{\rho l}b) - H_0^{(2)}(k_{\rho l}a)] \quad (23)$$

$$a_{ln}^{TE(j)}=0 \quad (24)$$

where $V_j=V_{ju}$ for $\overline{M}_{su}$ and $V_j=V_{jb}$ for $\overline{M}_{sb}$.

Next, the excitation terms of $a_{ln}^{TM(q)}$ and $a_{ln}^{TE(q)}$ for cylinder $q \neq j$ are calculated. The translation addition theorem is used, since $|\vec{\rho}' - \vec{\rho}_q| < |\vec{\rho}_j - \vec{\rho}_q|$.

Thus, for $q \neq j$, $$a_{ln}^{TM(q)} = \frac{jk}{2d}\frac{(-1)^{n+l}}{k_{\rho l}^2}f_l H_n^{(2)}(k_{\rho l}|\vec{\rho}_q - \vec{\rho}_j|)e^{jn\phi_{\vec{\rho}_q\vec{\rho}_j}} \times \quad (25)$$
$$\left[\frac{2\pi V_j}{\ln(b/a)}[J_0(k_{\rho l}b) - J_0(k_{\rho l}a)]\right]$$

After the exciting field coefficients are calculated, the surface current density on cylinder p is calculated from the above relationship. Then the current on cylinder (p) is:

$$I^{(p)} = \int_0^{2\pi} a d\phi \overline{J}_s^{(p)} \cdot \hat{z} \quad (26)$$
$$= 2\pi a \sum_l w_{l0}^{TM(p)}(\hat{z}) k_{\rho l} \frac{(2/\pi k_{\rho l} a)}{H_0^{(2)}(k_{\rho l} a)}\frac{1}{\eta}\{\cos k_{zl}(z \pm d/2)\}$$

Next, the general case is extended, with N cylinders having voltages $V_{1u}, V_{2u}, \ldots, V_{Nu}, V_{1b}, V_{2b}, \ldots$ and $V_{Nb}$. For sources at the upper aperture of $z'=d/2$, that is, $V_{1u}, V_{2u}, \ldots, V_{Nu}$, the incident wave at cylinder q is:

$$a_{ln}^{TM(q)} = \frac{jk}{2d}\frac{(-1)^{n+l}}{k_{\rho l}^2}f_l\frac{2\pi V_{qu}}{\ln(b/a)}\delta_{n0} \times \quad (27)$$
$$[H_0^{(2)}(k_{\rho l}b) - H_0^{(2)}(k_{\rho l}a)] + \sum_{j \neq q}^{N}\frac{jk}{2d}\frac{(-1)^{n+l}}{k_{\rho l}^2}f_l H_n^{(2)}$$
$$(k_{\rho l}|\vec{\rho}_q - \vec{\rho}_j|)e^{jn\phi_{\vec{\rho}_q\vec{\rho}_j}} \times$$
$$\left[\frac{2\pi V_{ju}}{\ln(b/a)}[J_0(k_{\rho l}b) - J_0(k_{\rho l}a)]\right].$$

The Foldy-Lax equations are solved for $w_{ln}^{TM(q)}$ and the currents are found at the cylinders, at $z=+d/2$. This current, $I^{uu}$, is the current at $z=d/2$ due to the source at $z'=d/2$:

$$I^{(p)uu} = \sum_l w_{l0}^{TM(p)} \frac{4}{\eta H_0^{(2)}(k_{\rho l}a)}(-1). \qquad (28)$$

The currents are then found at the cylinders, at $z=-d/2$. This current, $I^{bu}$, is the current at $-z=-d/2$ due to the source at $z'=d/2$:

$$I^{(p)bu} = \sum_l w_{l0}^{TM(p)} \frac{4}{\eta H_0^{(2)}(k_{\rho l}a)}. \qquad (29)$$

Next, consider the sources at the lower aperture of $-z'=d/2$, that is, $V_{1b}, V_{2b}, \ldots,$ and $V_{Nb}$. The Foldy-Lax equations are the same for this aperture.

Then the currents are found at the cylinders, at $z=+d/2$. This current, $I^{bb}$, is the current at the lower aperture $z=-d/2$ due to the sources of the lower aperture at $z'=-d/2$.

The total currents are $$I^{(p)u}=I^{(p)uu}+I^{(p)ub} \qquad (30)$$

$$I^{(p)b}=I^{(p)bu}+I^{(p)bb}. \qquad (31)$$

Matrix Notation for the Interior Problem

Suppose that there are N vias, that $l=L_{max}$, and that multipoles are limited to $n=\pm N_{max}$. Note that different $l$s are uncoupled. Then the dimension of $\overline{w}_l$ is $M=N\times(2N_{max}+1)$, when using a combined particle index $p=1, 2, \ldots, N$ and a multi-pole index $n=-N_{max}, -N_{max}+1, \ldots, 0, 1, N_{max}$. A combined index is then $\alpha-(q, n)-(2N_{max}+1)\times(q-1)$. Thus, $\alpha=1, 2, \ldots, M$. Let superscript T denote the transpose of a matrix:

$$\overline{w}_l^T = [w_{l(-N_{max})}^{(1)} w_{l(-N_{max}+1)}^{(1)} \ldots w_{l(N_{max})}^{(1)} \\ w_{l(-N_{max})}^{(2)} \ldots w_{l(N_{max})}^{(2)} \ldots w_{l(N_{max})}^{(N)}]. \qquad (32)$$

Thus, the dimension of the Foldy-Lax equations is M, and it is independent of the number of modes. That is, it is independent of the number of basis functions in the z-direction, if modes are used. On the other hand, if $N_z$ subsectional basis functions are used in the z-direction, then the dimension of the matrix equation is magnified $N_z$ times. This decoupling drastically reduces the size of the matrix equation, particularly at high frequencies.

The Foldy-Lax matrix $\overline{F}_l$ is of dimension $N(2N_{max}+1)\times N(2N_{max}+1)=M\times M$:

$$([\overline{F}_l])_{qn,pm} = \delta_{nm}\delta_{qp} - (1-\delta_{pq})H_{n-m}^{(2)}\times(k_{\rho l}|\overline{\rho}_p - \overline{\rho}_q|)e^{j(n-m)\phi_{\overline{p}_p\overline{p}_q}}T_m^{(N)}. \qquad (33)$$

Define $\overline{E}_l$ to be of dimension $M\times N$, so that $$(\overline{E}_l)_{qn,j} = ([\overline{a}_{lj}])_{qn} \qquad (34)$$

where $$([\overline{a}_{lj}])_{qn} = \frac{jk}{2d}\frac{(-1)^l}{k_{\rho l}^2}f_l\frac{2\pi}{\ln(b/a)}\delta_{n0}\times \qquad (35)$$

$$[H_0^{(2)}(k_{\rho l}b) - H_0^{(2)}(k_{\rho l}a)], \text{ if } q = j$$

$$= \frac{jk}{2d}\frac{(-1)^{n+l}}{k_{\rho l}^2}f_l H_n^{(2)}(k_{\rho l}|\overline{\rho}_q - \overline{\rho}_j|)e^{jn\phi_{\overline{p}_q\overline{p}_j}}2\frac{\pi}{\ln(b/a)}\times$$

$$[J_0(k_{\rho l}b) - J_0(k_{\rho l}a)], \text{ if } q \neq j.$$

Let voltage vectors $\overline{V}^u$ be of dimension N, with $(\overline{V}^u)_j=V_{ju}$.

In matrix form, the Foldy-Lax equation, for sources at $z'=d/2$, is:

$$\overline{F}_l\overline{w}_l^{(u)} = \overline{E}_l\overline{V}^u. \qquad (36)$$

After the Foldy-Lax equation is solved, the currents can be computed. Let $\overline{P}_l$ be of dimension $N\times N$:

$$(\overline{P}_l)_{p,j} = \left(\overline{F}_l^{-1}\overline{E}_l\right)_{p0,j}. \qquad (37)$$

The $p0,j$ index is due to the fact that only the $n=0$th harmonic contributes to the current at the terminal, as indicated by Equation 26. Next, define current vectors of dimension N, $\overline{I}^{uu}$, corresponding to the current at the upper aperture, at $z=d/2$, due to the sources at $z'=d/2$. Also, define current vectors of dimension N, $\overline{I}^{bu}$, which is the current at the lower aperture, at $z=-d/2$, due to the sources at $z'=d/2$. Then, $$\overline{I}^{uu} = \overline{Y}^{uu}\overline{V}^u \qquad (38)$$

$$\overline{I}^{bu} = \overline{Y}^{bu}\overline{V}^u \qquad (39)$$

where $\overline{Y}^{uu}$ and $\overline{Y}^{bu}$ are of dimension $N\times N$:

$$\overline{Y}^{uu} = \sum_l B_l \overline{P}_l \qquad (40)$$

$$\overline{Y}^{bu} = \sum_l D_l \overline{P}_l \qquad (41)$$

with $$B_l = \frac{4(-1)^l}{\eta H_0^{(2)}(k_{\rho l}a)} \qquad (42)$$

$$D_l = \frac{4}{\eta H_0^{(2)}(k_{\rho l}a)}. \qquad (43)$$

Similarly, define current vectors of dimension N, $\overline{I}^{ub}$, which is the current at the upper aperture, at $z=d/2$ due to the sources at $z'=d/2$. Also, define current vectors of dimension N, $\overline{I}^{bb}$, which is the current at the lower aperture, at $z=-d/2$ due to the sources at $z'=-d/2$.

Also, let voltage vectors $\overline{V}^b$ be of dimension N. Then, $$\overline{I}^{ub} = \overline{\overline{Y}}^{ub} \overline{V}^b \tag{44}$$

$$\overline{I}^{bb} = \overline{\overline{Y}}^{bb} \overline{V}^b. \tag{45}$$

Because of reflection symmetry of the waveguide about z=0, the symmetry relation of the admittance matrix elements is $\overline{\overline{Y}}^{ub} = \overline{\overline{Y}}^{bu}$ and $\overline{\overline{Y}}^{bb} = \overline{\overline{Y}}^{uu}$.

After the interior problem is solved, the solution is represented by $$\begin{bmatrix} \overline{I}^u \\ -\overline{I}^b \end{bmatrix} = -\overline{\overline{Y}} \begin{bmatrix} -\overline{V}^u \\ \overline{V}^b \end{bmatrix} \tag{46}$$

where $\overline{\overline{Y}}$ is a 2N×2N matrix:

$$\overline{\overline{Y}} = \begin{bmatrix} \overline{\overline{Y}}^{uu} & -\overline{\overline{Y}}^{ub} \\ -\overline{\overline{Y}}^{bu} & \overline{\overline{Y}}^{bb} \end{bmatrix} = \begin{bmatrix} \overline{\overline{Y}}^{uu} & -\overline{\overline{Y}}^{ub} \\ -\overline{\overline{Y}}^{ub} & \overline{\overline{Y}}^{uu} \end{bmatrix}. \tag{47}$$

Solving the Exterior Problem

As discussed above, once the admittance matrix is determined by employing the Foldy-Lax equations as described in detail above, those of ordinary skill will recognize that an equivalent circuit can readily be determined. Optionally, that equivalent circuit can be used as input in SPICE solver applications, as noted above.

The next step in the present invention is to solve the exterior problem, as indicated in block 33 of FIG. 5. The solver for the exterior problem uses MoM and the matrix pencil technique to extract the S parameters of the exterior structures. FIG. 18 shows the exterior structure for the case of a wire. The exterior problem is decomposed into a short circuit problem and a wire antenna problem. The short circuit problem relates the positive and negative waves with the short circuit current at the via port; the wire antenna problem relates the positive and negative waves with the voltage at the via port. The combined problem gives the relation of the port voltage and current as follows:

$$B_1 = \Gamma_{SC1} A_1 + T_{ant1} V_1 \tag{48}$$

$$I_1 = I_{SC1} A_1 + Y_{ant1} V_1$$

Combining the Interior & Exterior Problems to Obtain the Overall Scattering Matrix FIG. 19 schematically shows the interior and exterior problem connected. The interior and exterior problems are combined by equating the port voltages and currents of the two problems. FIG. 19 includes power/ground plane 18*a*, power/ground plane 18*b*, vias 12, 12*a* and 12*b*, apertures 16, and traces 14. Note that as shown in FIG. 19, the coupling effects between vias 12*a* and 12*b* are being modeled. Note also that each aperture corresponds to a port, as discussed above. For each port, there are four unknowns: A, B, V, and I. Two equations derive from the exterior problem, and one equation from the interior problem. The fourth equation can derive from the connection between this port and other ports. If this port is not connected with other ports, then it is an input port or a matched output port. In either case, there are only three unknowns: B, V, and I for this port. By solving a set of matrix equations, the relations between the incident wave $A_i$ and outgoing wave $B_i$ can be obtained, yielding the scattering matrix of the whole structure. FIG. 20 graphically illustrates the coupling effect between two active vias in the presence of 256 passive vias, obtained by combining the exterior and interior problems in accord with the present invention.

A more exhaustive mathematical description of solving the exterior problem, in accord with the present invention, will now be provided. For a single via 12 in FIG. 4, the exterior problem for z>d/2 has a magnetic current opposite that of the interior problem, but with the same voltage $$\overline{M}_s^{(e)}(\overline{\rho}') = \frac{V_{1b}}{|\overline{\rho}' - \overline{\rho}_1| \ln(b/a)} \hat{\phi}' \overline{\rho \rho_1}, \tag{49}$$

for $a \le |\overline{\rho}' - \overline{\rho}_1| \le b$.

Defining the current $I_{1u}$ and $I_{1b}$ as flowing out of the layer produces $$\begin{bmatrix} B_{1u} \\ I_{1u} \end{bmatrix} = \begin{bmatrix} \Gamma_{sc,1u} & T_{ant,1u} \\ I_{sc,1u} & Y_{ant,1u} \end{bmatrix} \begin{bmatrix} A_{1u} \\ -V_{1u} \end{bmatrix}. \tag{50}$$

For the exterior problem of the lower port, a magnetic current is provided that is opposite the interior problem. To maintain the same matrix form of Equation 50, the current will be flowing out of the waveguide slab, and is equal to $-I_{1b}$:

$$\overline{M}_s^{(e)}(\overline{\rho}') = \frac{V_{1b}}{|\overline{\rho}' - \overline{\rho}_1| \ln(b/a)} \hat{\phi}' \overline{\rho \rho_1} \text{ for } a \le |\overline{\rho}' - \overline{\rho}_1| \le b \tag{51}$$

$$\begin{bmatrix} B_{1b} \\ I_{1b} \end{bmatrix} = \begin{bmatrix} \Gamma_{sc,1b} & T_{ant,1b} \\ I_{sc,1b} & Y_{ant,1b} \end{bmatrix} \begin{bmatrix} A_{1b} \\ V_{1b} \end{bmatrix}. \tag{52}$$

The definitions are extended to N upper and lower ports. Define N×N diagonal matrices with $\overline{\overline{\Gamma}}_{sc}^{u}$, $\overline{\overline{\Gamma}}_{sc}^{b}$, $\overline{\overline{T}}_{ant}^{u}$, $\overline{\overline{T}}_{ant}^{b}$, $\overline{\overline{I}}_{sc}^{u}$, $\overline{\overline{I}}_{sc}^{b}$, $\overline{\overline{Y}}_{ant}^{u}$, and N×1 column matrices $\overline{A}^u$, $\overline{A}^b$, $\overline{B}^u$, $\overline{B}^b$.

Solving the combined problem of the exterior and interior problem gives a 2N×2N scattering matrix of $\overline{\overline{S}}$:

$$\begin{bmatrix} \overline{B}^u \\ \overline{B}^b \end{bmatrix} = \overline{\overline{S}} \begin{bmatrix} \overline{A}^u \\ \overline{A}^b \end{bmatrix} \tag{53}$$

$$\overline{\overline{S}} = \begin{bmatrix} \overline{\overline{S}}_{uu} & \overline{\overline{S}}_{ub} \\ \overline{\overline{S}}_{bu} & \overline{\overline{S}}_{bb} \end{bmatrix}. \tag{54}$$

Simplified Exterior Problem with a Given Characteristic Admittance

Consider the simplified case of identical traces for the exterior problem with a given characteristic admittance $Y_0$ of the traces:

$$\begin{bmatrix} \overline{\overline{T}}_{sc}^u & \overline{\overline{T}}_{ant}^u \\ \overline{\overline{I}}_{sc}^u & \overline{\overline{Y}}_{ant}^u \end{bmatrix} = \begin{bmatrix} \overline{\overline{T}}_{sc}^b & \overline{\overline{T}}_{ant}^b \\ \overline{\overline{I}}_{sc}^b & \overline{\overline{Y}}_{ant}^b \end{bmatrix} = \begin{bmatrix} -\overline{\overline{I}}_N & \overline{\overline{I}}_N \\ -2Y_0 \overline{\overline{I}}_N & Y_0 \overline{\overline{I}}_N \end{bmatrix}. \quad (55)$$

Then the scattering matrix simplifies to:

$$\overline{\overline{S}} = \{Y_0 \overline{\overline{I}}_{2N} + \overline{\overline{Y}}\}^{-1} \{Y_0 \overline{\overline{I}}_{2N} - \overline{\overline{Y}}\} \quad (56)$$

where $\overline{\overline{Y}}$ is the admittance matrix of the interior problem as given by Equation 47, and $\overline{\overline{I}}_{2N}$ is the unit matrix of dimension 2N.

For the case of two vias, the S-matrix is:

$$\overline{\overline{S}} = \begin{bmatrix} S_{1u1u} & S_{1u2u} & S_{1u1b} & S_{1u2b} \\ S_{2u1u} & S_{2u2u} & S_{2u1b} & S_{2u2b} \\ S_{1b1u} & S_{1b2u} & S_{1b1b} & S_{1b2u} \\ S_{2b1u} & S_{2b2u} & S_{2b1b} & S_{2b2b} \end{bmatrix} \quad (57)$$

For the case of 256 vias, the S-matrix is of dimension 512×512, with two ports for each via.

Small Via Radius and Small Layer Thickness Approximations

For the case of a small via radius, keep only $T_0^{TM}$ and discard all other $T_n^{TM}$. Then only the m=0 harmonics of the vias are coupled to each other, yielding the Foldy-Lax equation:

$$w_{l0}^{TM(q)} = a_{l0}^{TM(q)} + \sum_{\substack{p=1 \\ p \neq q}}^{N} H_0^{(2)}(k_{\rho l}|\overline{\rho}_p - \overline{\rho}_q|) T_0^{(N)} w_{l0}^{TM(p)}. \quad (58)$$

The dimension of the Foldy-Lax equation then becomes only N.

After the above Foldy-Lax equation is solved, the other azimuthal harmonic, if needed, can be calculated by using the Foldy-Lax equation for n≠0.

Since the currents are only dependent on $w_{l0}^{TM(p)}$ and not on another harmonic, it is not necessary to calculate the other harmonic $w_{ln}^{TM(p)}$. Next, assume that the thickness of the layer is small, so only the finite number of modes up to $l_{max}$ mode propagates from one cylinder to the other. This means that:

$$H_0^{(2)}(k_{\rho l}|\overline{\rho}_p - \overline{\rho}_q|) = 0, \text{ for } p \neq q \text{ and } l > l_{max} \quad (59)$$

$$\overline{\overline{F}}_l = \overline{\overline{I}}_N, \text{ for } l_{max} < L_{max}. \quad (60)$$

When only the TEM mode is propagating, $l_{max}$=0. Then the Foldy-Lax equation needs only to be solved for the TEM mode. However, the modes l≠0 contribute to the direct terms in near-field interaction, as given by the incident field coefficient in Equation 27, and are generally included. Using Equation 60 in Equation 37, $$\overline{\overline{Y}}^{uu} = B_0 \overline{\overline{P}}_0 + \sum_{l \neq 0} B_l \overline{\overline{E}}_l \quad (61)$$

$$\overline{\overline{Y}}^{bu} = D_0 \overline{\overline{P}}_0 + \sum_{l \neq 0} D_l \overline{\overline{E}}_l \quad (62)$$

where $\overline{\overline{E}}_l$ for l>0 is a diagonal matrix as a result of Equations 33 and 35 when only the l=0 mode propagates.

With reference to FIG. 21, a generally conventional computing device 230 is illustrated, which is suitable for use in practicing the concepts discussed in detail above. Those of ordinary skill in the art will recognize that computing device 230 can be implemented using a generally conventional personal computer that is coupled to a memory media 231 in which are stored machine instructions for carrying out steps generally consistent with those described in detail above (particularly, with respect to the flowchart shown in FIG. 5). Generally, computing device 230 includes a chassis 232, in which are mounted a hard drive 236, a floppy drive 234, and/or an optical disk drive 247. A motherboard within the processor chassis is populated with appropriate integrated circuits (not shown) and a power supply (also not shown). A monitor 238 is included for displaying graphics and text generated by software programs executed by the computing device. User input is provided by a mouse 240 (or other pointing device) and/or with a keyboard 243, coupled to the motherboard and used, for example, to control a cursor and to select menu options, and graphic components displayed on monitor 238 in response to software programs executing on the computing device, including a software program implementing the concepts discussed above (i.e., by executing the machine instructions stored in memory media 231). Those of ordinary skill in the art will recognize that it is the machine instructions residing on memory media 231 that distinguish computing device 230 over conventional computing devices. Further, it should be recognized that memory media 231 can comprise hard drive 236, an appropriate floppy disk inserted into floppy drive 234, or optical disk drive 247, or external memory media logically coupled to computing device 230 (such as a networked or portable memory storage device).

Although the present invention has been described in connection with the preferred form of practicing it, those of ordinary skill in the art will understand that many modifications can be made thereto within the scope of the claims that follow. Accordingly, it is not intended that the scope of the invention in any way be limited by the above description, but instead be determined entirely by reference to the claims that follow.

The invention claimed is:

1. A method for determining at least one of a signal reflection, a signal transmission, and a signal coupling among vias in a multi-via electronic package, wherein said electronic package comprises a plurality of vias and at least two parallel layers, comprising the steps of:

(a) creating a model of the electronic package as an interior problem and an exterior problem, relative to the at least two parallel layers;

(b) determining parameters relating to the vias and the parallel planes corresponding to the at least two parallel layers for use in solving said interior problem and said exterior problem;

(c) solving the interior problem to determine a first property of the model based on the parameters that were determined, such that the interior problem is solved by:
  (i) determining exciting waves using dyalic Green's function; and
  (ii) determining an admittance matrix using Foldy-Lax equation;

(d) using the first property and the parameters to solve the exterior problem, to determine a second property of the model;

(e) using the second property to determine at least one result selected from the group consisting of: the signal reflection, the signal transmission, and the signal coupling among vias in the electronic structure; and (f) having determined the at least one result, executing at least one step selected from the group consisting of the following steps:
  (i) storing the result for later use; and
  (ii) outputting the result to a user.

2. The method of claim 1, wherein the second property comprises a scattering matrix.

3. The method of claim 1, further comprising the step of determining an equivalent circuit for the electronic package using the first property.

4. The method of claim 3, further comprising the step of analyzing the equivalent circuit with a circuit analysis program.

5. The method of claim 1, wherein the step of determining the admittance matrix comprises the step of relating the exciting waves, incident waves, and scattered waves.

6. The method of claim 1, wherein the step of determining the admittance matrix using the Foldy-Lax equations comprises the steps of:
  (a) assuming each via is a cylindrical perfect electric conductor;
  (b) decoupling transverse electric waves and transverse magnetic waves at each via; and
  (c) separately solving the Foldy-Lax equations for each of a plurality of waveguide modes defined by the at least two layers.

7. The method of claim 6, wherein the step of separately solving the Foldy-Lax equations is simplified by assuming that radii of the vias are sufficiently small to substantially limit harmonic factors of the vias that must be included.

8. The method of claim 6, wherein the step of separately solving the Foldy-Lax equation is simplified by assuming that a separation distance between the substantially parallel layers is sufficiently small to substantially reduce a number of propagating modes for non-near field interactions.

9. The method of claim 1, wherein the first property comprises the admittance matrix.

10. The method of claim 1, wherein the exterior problem relates to traces with magnetic surface currents, and wherein the step of solving the exterior problem comprises the steps of:
  (a) integrating the first property into the exterior problem by relating a port voltage and a current relative to the vias; and
  (b) determining the second property using method of moment and matrix pencil algorithms.

11. The method of claim 1, wherein the model comprises more than two vias.

12. An article of manufacture adapted for use with a processor for use in determining at least one of a signal reflection, a signal transmission, and a signal coupling among vias in a multi-via electronic package, wherein said electronic package comprises a plurality of vias and at least two parallel layers, said article of manufacture comprising:
  (a) a memory medium; and
  (b) a plurality of machine instructions stored on the memory medium, said plurality of machine instructions when executed by a processor, causing the processor to:
    (i) enable a user to input parameters relating to the vias of the electronic package, which is modeled as an interior problem and an exterior problem, relative to the at least two parallel layers;
    (ii) solve the interior problem of the model of the electronic package to determine an admittance matrix, based on the parameters that were input, where the interior problem is solved by determining exciting waves using dyadic Green's function, and by determining an admittance matrix using Foldy-Lax equations;
    (iii) solve the exterior problem of the model using the admittance matrix, to determine a scattering matrix; and
    (iv) use the scattering matrix to determine at least one of the signal reflection, the signal transmission, and the signal coupling among vias in the electronic package.

13. The article of manufacture of claim 12, wherein the plurality of machine instructions, when executed by a processor, further cause the processor to determine an equivalent circuit for the electronic package, using the admittance matrix.

14. The article of manufacture of claim 13, wherein the plurality of machine instructions, when executed by a processor, further cause the processor to analyze the equivalent circuit with a circuit analysis program.

15. The article of manufacture of claim 12, wherein the plurality of machine instructions, when executed by a processor, further cause the processor to input the scattering matrix into a microwave network model for analysis of the electronic package.

16. A system for determining at least one of a signal reflection, a signal transmission, and a signal coupling among vias in a multi-via electronic package, wherein said electronic package comprises a plurality of vias and at least two parallel layers, comprising:
  (a) a memory in which a plurality of machine instructions defining an electronic package analysis program are stored;
  (b) a user input device;
  (c) a display; and
  (d) a processor that is coupled to the user input device to receive a user input, to the memory to access the machine instructions, and to the display, said processor executing said machine instructions and thereby implementing a plurality of functions, including:
    (i) enabling a user to input parameters relating to the vias and the at least two parallel layers of an electronic package, which is modeled as an interior problem and an exterior problem, relative to the at least two parallel layers;
    (ii) solving the interior problem of the model for the electronic package, to determine an admittance matrix, based on the parameters that were input, where the interior problem is solved by determining exciting waves using dyadic Green's function, and by determining an admittance matrix using Foldy-Lax equations;

(iii) solving the exterior problem of the model for the electronic package using the admittance matrix to determine a scattering matrix; and (iv) enabling a user to use the scattering matrix to determine at least one of the signal reflection, the signal transmission, and the signal coupling among vias in the electronic package.

17. The system of claim 16, wherein, the machine instructions, when executed by a processor, further cause the processor to determine an equivalent circuit for the electronic package, using the admittance matrix.

18. The system of claim 17, wherein the machine instructions, when executed by a processor, further cause the processor to analyze the equivalent circuit with a circuit analysis program.

19. The system of claim 16, wherein the machine instructions, when executed by a processor, further cause the processor to input the scattering matrix into a microwave network model for analysis.

20. A method for modeling an electronic package that comprises a plurality of vias and at least two parallel layers defining spaced-apart parallel planes, for use in simulating characteristics of the electronic package to evaluate a design of the electronic package, comprising the steps of:

(a) modeling the electronic package, producing a model represented by an interior problem and an exterior problem;

(b) determining parameters relating to the vias and the parallel planes corresponding to the at least two parallel layers for use in solving said interior problem and said exterior problem;

(c) solving the interior problem to determine an admittance matrix of the electronic package, based on the parameters that were determined, wherein the interior problem is solved by determining an exciting wave using dyadic Green's function and by determining the admittance matrix using Foldy-Lax equations;

(d) solving the exterior problem using the admittance matrix and the parameters that were determined to determine a scattering matrix, said scattering matrix being useful for evaluating the design of the electronic package; and (e) having determined the scattering matrix, executing at least one step selected from the group consisting of the following steps:

(i) storing the result for later use; and (ii) outputting the result to a user.

21. The method of claim 20, further comprising the step of determining an equivalent circuit for the electronic package using the admittance matrix.

22. The method of claim 21, further comprising the step of using at least one of the equivalent circuit and the scattering matrix to determine at least one of a signal reflection, a signal transmission, and a signal coupling among vias in the electronic package.

23. The method of claim 22, wherein the step of using at least one of the equivalent circuit and the scattering matrix comprises the step of integrating the scattering matrix into a microwave network model.

24. The method of claim 22, further comprising the step of analyzing the equivalent circuit with a circuit analysis program.

25. The method of claim 20, wherein the step of determining the admittance matrix using the Foldy-Lax equations comprises the steps of:

(a) assuming each via is a cylindrical perfect electric conductor;

(b) decoupling transverse electric waves and transverse magnetic waves at the vias; and (c) separately solving the Foldy-Lax equations for each of a plurality of waveguide modes, relative to the at least two parallel planes.

26. The method of claim 20, wherein the step of solving the exterior problem comprises the steps of integrating the admittance matrix into the exterior problem by relating a port voltage and a current for the vias, and then determining the scattering matrix using method of moments and matrix pencil method algorithms.

27. A method for modeling an electronic package that comprises a plurality of vias and at least two parallel layers defining spaced-apart parallel planes, for simulating characteristics of electronic packages to evaluate a design of the electronic package, comprising the steps of:

(a) representing voltages at active via ports as magnetic ring current sources;

(b) decomposing signal coupling among vias into an exterior problem with magnetic surface currents and an interior problem with magnetic surface currents;

(c) determining parameters relating to the vias and the parallel planes corresponding to the at least two parallel layers, for use in solving said interior problem and said exterior problem;

(d) solving the interior problem to determine an admittance matrix for the electronic package, based on the parameters that were determined, where the interior problem is solved by:

(i) applying dyadic Green's function, expressed in terms of vector cylindrical waves and waveguide modes, to determine exciting waves for the electronic packages;

(ii) using Foldy-Lax equations to relate the exciting waves, incident waves, and scattering waves, thus decoupling each waveguide mode for the parallel layers, and obtaining the admittance matrix of an interior geometry of the electronic packages;

(e) solving the exterior problem using the parameters that were determined and the admittance matrix, to determine a scattering matrix;

(f) relating the admittance matrix and the scattering matrix by imposing a condition of equal and opposite magnetic surface currents; and (g) having determined the relationship between the admittance matrix and the scattering matrix, executing at least one step selected from the group consisting of the following steps:

(i) storing the result for later use; and (ii) outputting the result to a user.

28. The method of claim 27, further comprising the step of determining an equivalent circuit for the electronic package using the admittance matrix.

29. The method of claim 27, wherein the step of using the Foldy-Lax equations assumes that radii of the vias are sufficiently small to substantially reduce a number of harmonics used in the Foldy-Lax equations.

30. The method of claim 27, wherein the step of using the Foldy-Lax equations assumes that a separation between the parallel layers is sufficiently small to substantially reduce a number of propagating modes.

31. The method of claim 28, wherein the step of determining the equivalent circuit comprises the step of obtaining the surface magnetic currents on the surfaces around the vias by integrating the magnetic field over a cylinder representing each of the vias.

32. The method of claim 27, wherein the step of solving the exterior problem comprises the steps of:
 (a) integrating the admittance matrix with the exterior problem by relating a port voltage and a current at the vias; and (b) utilizing method of moments and the matrix pencil method algorithms to determine the scattering matrix.

33. The method of claim 27, further comprising the step of integrating the admittance matrix and the scattering matrix into a system simulation by utilizing a microwave network model.

34. The method of claim 28, further comprising the step of analyzing the equivalent circuit from the admittance and scattering matrices with a circuit analysis program.

* * * * *

UNITED STATES PATENT AND TRADEMARK OFFICE
CERTIFICATE OF CORRECTION

PATENT NO.       : 7,149,666 B2
APPLICATION NO.  : 10/159965
DATED            : December 12, 2006
INVENTOR(S)      : Tsang et al.

It is certified that error appears in the above-identified patent and that said Letters Patent is hereby corrected as shown below:

Column 5, line 32 after "problems;" delete "and"

Column 9, line 54 (Equation 3)   " $-\hat{\rho}\dfrac{jk_\rho k_2}{k}$ " should read -- $-\hat{\rho}\dfrac{jk_\rho k_z}{k}$ --

Column 12, line 15   " $(\overline{92}', z' = -d/2)$ " should read -- $(\overline{\rho}', z' = -d/2)$ --

Column 12, line 60 (Equation 14)   " $e^{j(n-m)\phi\overline{\rho_p \rho_q}} T_m^{(N)} w_{lm}^{TE(p)}$ " should read -- $e^{j(n-m)\phi\overline{\rho_p \rho_q}} T_m^{(M)} w_{lm}^{TE(p)}$ --

Column 13, line 40 (Equation 18)   " $J_s^{(p)} = \sum_{m,l} w_{lm}^{TM(p)} \overline{J}_s^{TM}\left(k_{\rho l}, k_{zl}, x \pm d/2\right) +$ " should read -- $J_s^{(p)} = \sum_{m,l} w_{lm}^{TM(p)} \overline{J}_s^{TM}\left(k_{pl}, k_{zl}, z \pm d/2\right) +$ --

Column 15, line 44 (Equation 32)   " $\overline{w}_l^T = \left[w_{l(-N_{max})}^{(1)} \; w_{l(-N_{max}+1)}^{(1)} \cdots w_{l(N_{max})}^{(1)}\right.$ " should $\left. w_{l(-N_{max})^{(2)}} \cdots w_{l(N_{max})}^{(2)} \cdots w_{l(N_{max})}^{(N)}\right]$ read -- $\overline{w}_l^T = \left[w_l^{(1)}(-N_{max}) w_l^{(1)}(-N_{max}+1) \cdots w_l^{(1)}(N_{max})\right.$ --

$\left. w_l^{(2)}(-N_{max}) \cdots w_l^{(2)}(N_{max}) \cdots w_l^{(N)}(N_{max})\right]$ Column 15, line 59 (Equation 33)   " $\left(\left[\overline{\overline{F}}_l\right]\right)_{qn,pm} = \delta_{nm}\delta_{qp} - (1-\delta_{pq})H_{n-m}^{(2)} \times$ " should read $(k_{\rho l}|\overline{\rho}_p - \overline{\rho}_q|)e^{j(n-m)\phi\overline{\rho}_p P_q} T_m^{(N)}$ -- $\left[\overline{\overline{F}}_l\right]_{qn,pm} = \delta_{nm}\delta_{qp} - (1-\delta_{pq})H_{n-m}^{(2)} \times$ --

$(k_{\rho l}|\overline{\rho}_p - \overline{\rho}_q|)e^{j(n-m)\phi\overline{\rho}_p P_q} T_m^{(N)}$

UNITED STATES PATENT AND TRADEMARK OFFICE
CERTIFICATE OF CORRECTION

PATENT NO. : 7,149,666 B2
APPLICATION NO. : 10/159965
DATED : December 12, 2006
INVENTOR(S) : Tsang et al.

It is certified that error appears in the above-identified patent and that said Letters Patent is hereby corrected as shown below:

Column 16, line 9 (Equation 35)

"
$$(\overline{\overline{a}}_{lj})_{qn} = \frac{jk}{2d}\frac{(-1)^l}{k_{pl}^2}f_l\frac{2\pi}{\ln(b/a)}\delta_{nO} \times$$
$$\left[H_0^{(2)}(k_{\rho l}b) - H_0^{(2)}(k_{\rho l}a)\right] \text{if } q = j$$
$$= \frac{jk}{2d}\frac{(-1)^{n+1}}{k_{pl}^2}f_1 H_n^{(2)}(k_{\rho l}|\overline{\rho}_q - \overline{\rho}_j|)e^{jn\phi\overline{\rho_q e_j}} 2\frac{\pi}{\ln(b/a)} \times$$
$$\left[J_0(k_{\rho l}b) - J_0(k_{\rho l}a)\right] \text{if } q \neq j$$
"

should read

-- 
$$(\overline{\overline{a}}_{lj})_{qn} = \frac{jk}{2d}\frac{(-1)^l}{k_{pl}^2}f_l\frac{2\pi}{\ln(b/a)}\delta_{nO} \times$$
$$\left[H_0^{(2)}(k_{\rho l}b) - H_0^{(2)}(k_{\rho l}a)\right] \text{if } q = j$$
$$= \frac{jk}{2d}\frac{(-1)^{n+1}}{k_{pl}^2}f_1 H_n^{(2)}(k_{\rho l}|\overline{\rho}_q - \overline{\rho}_j|)e^{jn\phi\overline{\rho_q e_j}} \frac{2\pi}{\ln(b/a)} \times$$
$$\left[J_0(k_{\rho l}b) - J_0(k_{\rho l}a)\right] \text{if } q \neq j$$
--

Signed and Sealed this

Fourth Day of September, 2007

JON W. DUDAS
*Director of the United States Patent and Trademark Office*